(12) United States Patent
Misaki

(10) Patent No.: US 10,879,304 B2
(45) Date of Patent: Dec. 29, 2020

(54) ACTIVE MATRIX SUBSTRATE, X-RAY IMAGING PANEL INCLUDING SAME AND PRODUCING METHOD THEREOF

(71) Applicant: SHARP KABUSHIKI KAISHA, Sakai (JP)

(72) Inventor: Katsunori Misaki, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 76 days.

(21) Appl. No.: 16/277,960

(22) Filed: Feb. 15, 2019

(65) Prior Publication Data

US 2019/0259803 A1   Aug. 22, 2019

(30) Foreign Application Priority Data

Feb. 16, 2018   (JP) .................................. 2018-026464

(51) Int. Cl.
  *H01L 27/146*   (2006.01)
  *G01T 1/20*   (2006.01)
  *G01T 1/24*   (2006.01)

(52) U.S. Cl.
  CPC ...... *H01L 27/14663* (2013.01); *G01T 1/2018* (2013.01); *G01T 1/24* (2013.01); *H01L 27/14612* (2013.01); *H01L 27/14692* (2013.01); *H01L 27/14603* (2013.01); *H01L 27/14689* (2013.01)

(58) Field of Classification Search
  CPC ............. H01L 27/14663; H01L 27/124; H01L 27/127; H01L 27/14603; H01L 27/14612; H01L 27/14692; H01L 31/115; H01L 27/14689; G01T 1/2018; G01T 1/24
  See application file for complete search history.

(56) References Cited

U.S. PATENT DOCUMENTS

| 6,480,577 | B1 * | 11/2002 | Izumi | G02F 1/136213 257/546 |
| 7,723,136 | B2 * | 5/2010 | Watanabe | H01L 27/14632 438/30 |
| 9,041,111 | B2 * | 5/2015 | Xie | H01L 27/14692 257/359 |
| 2003/0038306 | A1 * | 2/2003 | Izumi | G02F 1/136213 257/222 |

(Continued)

FOREIGN PATENT DOCUMENTS

JP   2011-159781 A   8/2011
JP   2014-078651 A   5/2014

*Primary Examiner* — Taeho Jo
(74) *Attorney, Agent, or Firm* — ScienBiziP, P.C.

(57) ABSTRACT

An active matrix substrate 1 includes a plurality of detection circuitry. The detection circuitry includes a photoelectric conversion layer 15, a pair of a first electrode 14*a* and a second electrode 14*b*, a protection film 106, and a bias line 16. The protection film 106 covers a side end part of the photoelectric conversion layer 15, and overlaps with at least a part of the second electrode 14*b*. The bias line 16 is provided on an outer side of the photoelectric conversion layer 15. An electrode portion of the second electrode 14*b* that overlaps with the bias line 16 has at least one electrode opening 141*h*. The bias line 16 is in contact with the electrode portion of the second electrode 14*b* on an outer side of the photoelectric conversion layer 15, and is in contact with the protection film 106 in the electrode opening 141*h*.

8 Claims, 23 Drawing Sheets

(56) References Cited

U.S. PATENT DOCUMENTS

| | | | | |
|---|---|---|---|---|
| 2010/0059804 | A1* | 3/2010 | Hayashi | H01L 27/14692 |
| | | | | 257/292 |
| 2011/0127593 | A1* | 6/2011 | Hayashi | H01L 27/14663 |
| | | | | 257/292 |
| 2012/0069260 | A1* | 3/2012 | Misaki | G02F 1/136213 |
| | | | | 349/43 |
| 2012/0080605 | A1* | 4/2012 | Kawanabe | G01T 1/243 |
| | | | | 250/370.08 |
| 2012/0126128 | A1* | 5/2012 | Watanabe | H01L 27/14632 |
| | | | | 250/369 |
| 2012/0168759 | A1* | 7/2012 | Lee | H01L 27/14663 |
| | | | | 257/59 |
| 2013/0092940 | A1* | 4/2013 | Tezuka | H01L 29/41783 |
| | | | | 257/52 |
| 2013/0206993 | A1* | 8/2013 | Ibuki | G01T 1/2006 |
| | | | | 250/366 |
| 2014/0103347 | A1* | 4/2014 | Ishino | H01L 27/14689 |
| | | | | 257/59 |
| 2015/0187917 | A1* | 7/2015 | Tezuka | H01L 21/463 |
| | | | | 438/104 |
| 2016/0104734 | A1* | 4/2016 | Hirose | H01L 27/1225 |
| | | | | 257/43 |
| 2016/0126283 | A1* | 5/2016 | Ohmaru | H04N 5/3698 |
| | | | | 348/374 |
| 2016/0336363 | A1* | 11/2016 | Dairiki | H01L 27/14607 |
| 2017/0139056 | A1* | 5/2017 | Tomiyasu | H01L 27/14612 |
| 2017/0148834 | A1* | 5/2017 | Tomyo | H01L 27/14665 |
| 2017/0154915 | A1* | 6/2017 | Tomiyasu | G01T 1/20 |
| 2018/0039882 | A1* | 2/2018 | Ikeda | G06N 3/04 |
| 2019/0187309 | A1* | 6/2019 | Misaki | G01T 1/2018 |
| 2019/0296076 | A1* | 9/2019 | Misaki | H01L 27/14692 |
| 2019/0355774 | A1* | 11/2019 | Misaki | H04N 5/32 |

* cited by examiner

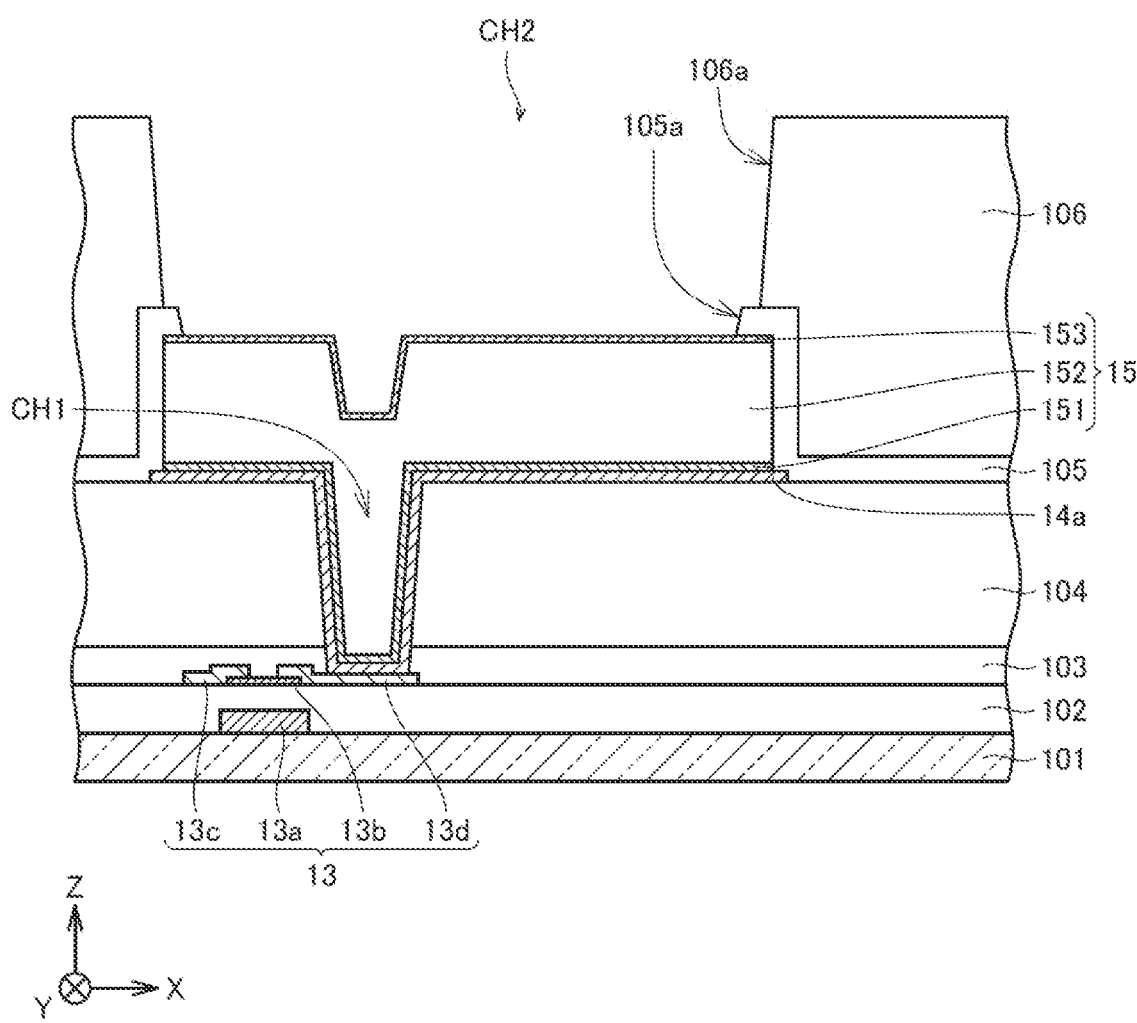

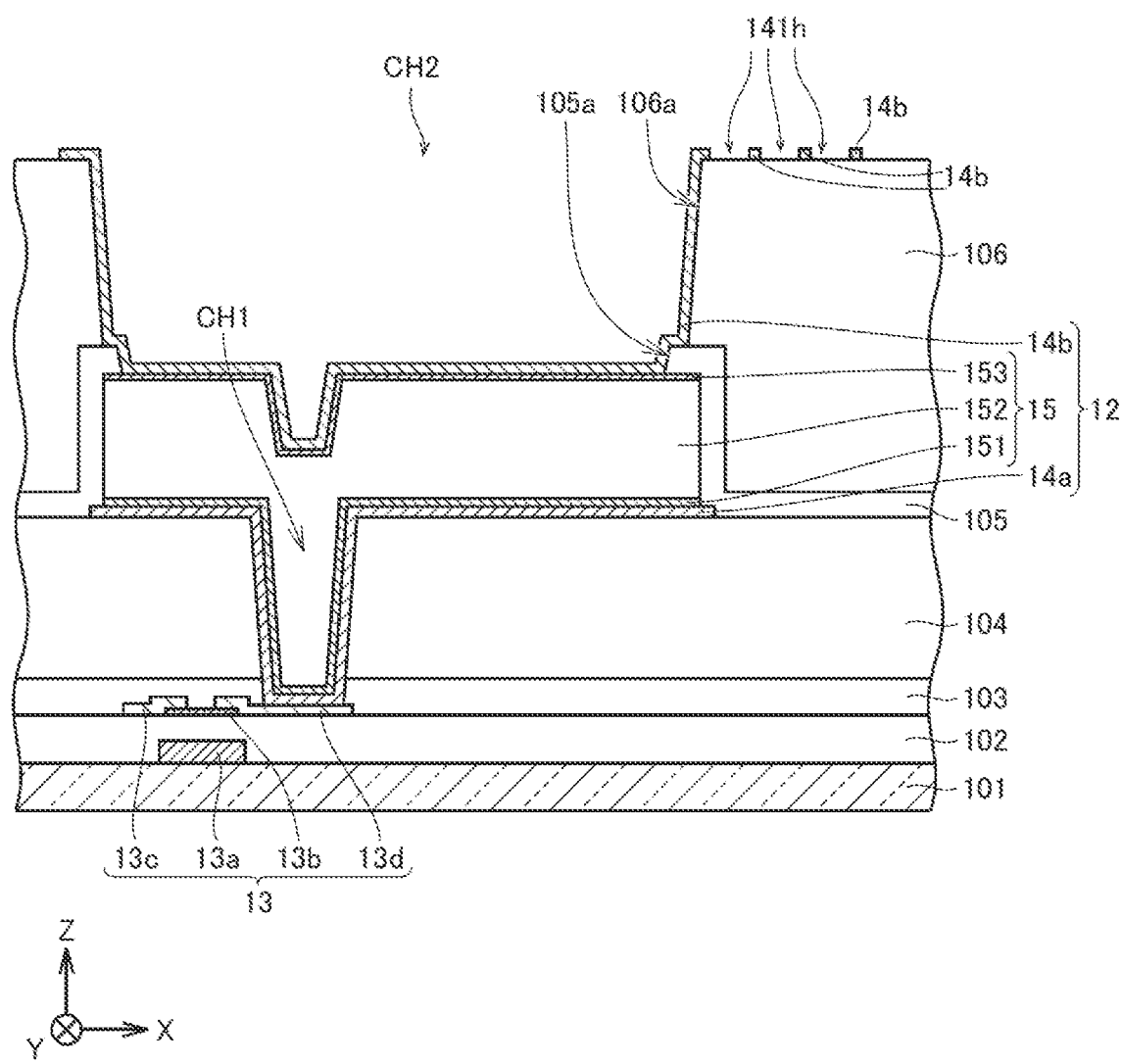

ACTIVE MATRIX SUBSTRATE, X-RAY IMAGING PANEL INCLUDING SAME AND PRODUCING METHOD THEREOF

TECHNICAL FIELD

The present invention relates to an active matrix substrate, an X-ray imaging panel including the same, and a method for producing the same.

BACKGROUND ART

Conventionally, an X-ray imaging device is known that includes thin film transistors (also referred to as "TFTs") in a plurality of areas arranged in matrix (hereinafter referred to as pixel portions), and picks up an image of irradiated X-rays with a plurality of pixel portions. In such an X-ray imaging device, for example, p-intrinsic-n (PIN) photodiodes are used as photoelectric conversion elements that convert irradiated X-rays into charges. The converted charges are read out by causing the TFTs of the respective pixels portions to operate. With the charges being read out in this way, an X-ray image is obtained.

Patent Document 1 discloses such an X-ray imaging device. More specifically, in the configuration disclosed in Patent Document 1, of a pair of electrodes between which the photodiode is interposed, i.e., a first electrode and a second electrode, the first electrode is connected with a TFT, and the second electrode is connected with a bias line. The bias line is formed over an entire light incident surface of each pixel portion.

PRIOR ART DOCUMENT

Patent Document

Patent Document 1: JP-A-2011-159781

SUMMARY OF THE INVENTION

In the configuration disclosed in Patent Document 1, in a case where, for example, a transparent conductive film such as a film of indium tin oxide (ITO) is used as the second electrode, and a metal film is used as the bias line, the second electrode and the bias line have poor adhesiveness to each other, and the bias line peels off in some cases. If the bias line peels off from the second electrode, a voltage from the bias line is not applied to the PIN diode, and X-rays cannot be appropriately detected.

It is an object of the present invention to decrease detection defects due to peeling-off of the bias lines.

An active matrix substrate to solve the above-described problem is an active matrix substrate having a plurality of detection circuitry arranged in matrix. Each of the detection circuitry includes a photoelectric conversion layer; a pair of a first electrode and a second electrode between which the photoelectric conversion layer is interposed; a protection film that covers a side end part of the photoelectric conversion layer, and overlaps with at least a part of the second electrode; and a bias line that is provided on an outer side of the photoelectric conversion layer, and applies a bias voltage to the second electrode, wherein a one-side end of the second electrode reaches at least to a position of the bias line, and in the second electrode, an electrode portion that overlaps with the bias line has at least one electrode opening, and the bias line is in contact with the electrode portion of the second electrode on the outer side of the photoelectric conversion layer, and is in contact with the protection film in the electrode opening.

With the present invention, detection defects due to peeling-off of the bias lines can be decreased.

BRIEF DESCRIPTION OF DRAWINGS

FIG. 6L is a cross-sectional view showing a step of patterning the fourth insulating film shown in FIG. 6K so as to form an opening in the fourth insulating film.

FIG. 6N is a cross-sectional view showing a step of patterning the transparent conductive film shown in FIG. 6M so as to form the upper electrode, and carrying out an oxygen plasma ashing treatment.

MODE FOR CARRYING OUT THE INVENTION

Figure 1:
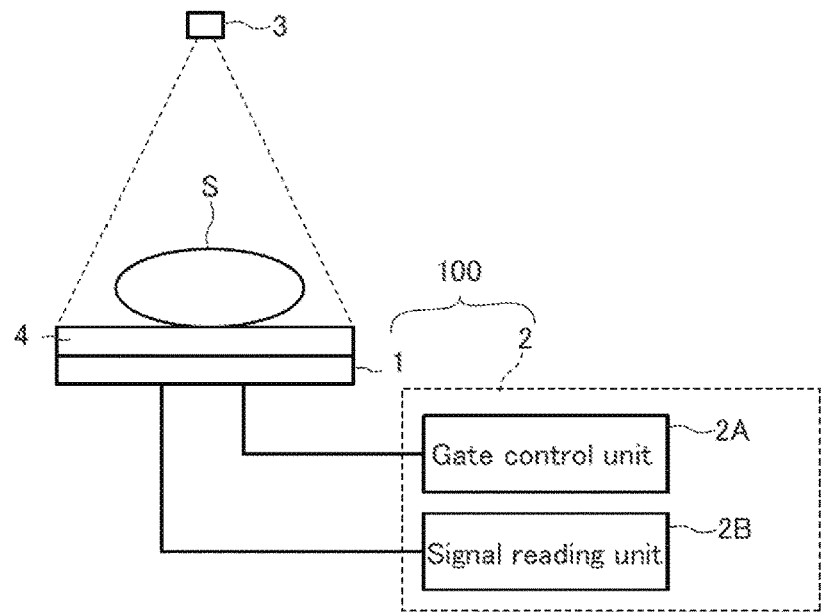
FIG. 1 schematically shows an X-ray imaging device in Embodiment 1.

An active matrix substrate according to one embodiment of the present invention is an active matrix substrate having a plurality of detection circuitry arranged in matrix. Each of the detection circuitry includes a photoelectric conversion layer; a pair of a first electrode and a second electrode between which the photoelectric conversion layer is interposed; a protection film that covers a side end part of the photoelectric conversion layer, and overlaps with at least a part of the second electrode; and a bias line that is provided on an outer side of the photoelectric conversion layer, and applies a bias voltage to the second electrode, wherein a one-side end of the second electrode reaches at least to a position of the bias line, and in the second electrode, an electrode portion that overlaps with the bias line has at least one electrode opening, and the bias line is in contact with the electrode portion of the second electrode on the outer side of the photoelectric conversion layer, and is in contact with the protection film in the electrode opening (the first configuration).

According to the first configuration, of the first electrode and the second electrode between which the photoelectric conversion layer is interposed, the second electrode is connected with the bias line. In the second electrode, a one-side end thereof connected with the bias line has at least one electrode opening. The bias line is in contact with the protection film in the electrode opening, and at the same time, is in contact with a part of the second electrode. Even in a case where the second electrode is formed with a transparent conductive film and the bias line is formed with a metal film, since the bias line is also in contact with the protection film through the electrode opening, the adhesiveness of the bias line is improved, as compared with a case where no electrode opening is provided. As a result, light detection defects due to peeling-off of the bias line can be decreased. Further, the bias line is provided on an outer side of the photoelectric conversion layer and is connected with the electrode portion of the second electrode. Even if the bias line is formed with a metal film, the transmittance of each detection circuitry therefore does not decrease, whereby it is unlikely that the quantum efficiency would decrease, as compared with a case where the bias line and the second electrode are connected with each other above the photoelectric conversion layer.

The first configuration may be further characterized in that the protection film is an inorganic insulating film, has an opening at a position overlapping the photoelectric conversion layer in a planar view, and is provided so as to cover a side surface of the photoelectric conversion layer, and the second electrode is in contact with the photoelectric conversion layer in the opening (the second configuration).

According to the second configuration, the protection film is an inorganic insulating film that has an opening at the position overlapping the photoelectric conversion layer in a planar view, and the second electrode is in contact with the photoelectric conversion layer in the opening of the inorganic insulating film. Since the bias line is in contact with the inorganic insulating film in the electrode opening of the second electrode, peeling-off of the bias line can be decreased, as compared with a case where the bias line is in contact with only the second electrode.

The first configuration may be further characterized in further including an inorganic insulating film that has an opening at a position overlapping the photoelectric conversion layer in a planar view, and is in contact with a side surface of the photoelectric conversion layer, wherein the protection film is an organic insulating film, and overlaps with the side surface of the photoelectric conversion layer with the inorganic insulating film being interposed therebetween; and the second electrode is in contact with the photoelectric conversion layer in the opening (the third configuration).

According to the third configuration, the side surface of the photoelectric conversion layer is covered with the inorganic insulating film and the protection film as the organic insulating film, and the second electrode is in contact with the photoelectric conversion layer in the opening of the inorganic insulating film. Since the bias line is in contact with the protection film as the organic insulating film in the electrode opening, it is unlikely that the bias line would peel off, as compared with a case where the bias line is in contact with only the second electrode. Further, since the surface of the photoelectric conversion layer is covered with the inorganic insulating film and the organic insulating film, it is unlikely that moisture would go in through the side surface of the photoelectric conversion layer, and leakage current would flow on the side surface of the photoelectric conversion layer.

Any one of the first to third configurations may be further characterized in that the protection film at a bottom of the electrode portion of the second electrode having the electrode opening is recessed toward an inner side of the electrode portion of the second electrode (the fourth configuration)

With the fourth configuration, the bias line is in contact with the electrode portion of the second electrode and the protection film in the recessed portion of the protection film. Thereby the contact area where the bias line and the electrode portion of the second electrode as well as the protection film are in contact with each other increases, resulting in that the adhesiveness of the bias line can be increased, as compared with a case where the protection film at the bottom of the electrode portion of the second electrode having the electrode opening is flat.

Any one of the first to fourth configurations may be further characterized in that the electrode portion of the second electrode adjacent to the electrode opening is tapered (the fifth configuration).

With the fifth configuration, the contact area where the bias line and the electrode portion of the second electrode are in contact with each other increases, resulting in that it is unlikely that the bias line would peel off, as compared with a case where the electrode portion of the second electrode adjacent to the electrode opening is not tapered.

An X-ray imaging panel according to one embodiment of the present invention includes: the active matrix substrate of any one of the first to fifth configurations; and a scintillator that covers irradiated X-rays into scintillation light (the sixth configuration).

With the sixth configuration, scintillation light detection defects due to peeling-off of the bias line can be decreased.

A method for producing an active matrix substrate according to one embodiment of the present invention is a method for producing an active matrix substrate including a plurality of detection circuitry arranged in matrix, and the producing method includes the steps of, in each of areas where the detection circuitry on the substrate are provided, respectively: forming a first electrode; forming a photoelectric conversion layer on the first electrode; forming a protection film that has an opening on the photoelectric conversion layer and covers a side surface; forming a second electrode that is in contact with the photoelectric conversion layer in the opening, and overlaps with the protection film on an outer side of one of ends of the photoelectric conversion layer; and forming a bias line that overlaps with the second electrode on the outer side of the one of the ends of the photoelectric conversion layer, wherein the second electrode has at least one electrode opening in an electrode portion that overlaps with the bias line, and the bias line is in contact with the protection film in the electrode opening (the first producing method).

According to the first producing method, of the first electrode and the second electrode between which the photoelectric conversion layer is interposed, the second electrode is connected with the bias line. In the second electrode, a one-side end thereof connected with the bias line has at least one electrode opening. The bias line is in contact with the protection film in the electrode opening, and at the same time, is in contact with a part of the second electrode. Since the bias line is also in contact with the protection film through the electrode opening, even in a case where the second electrode is formed with a transparent conductive film and the bias line is formed with a metal film, it is unlikely that the bias line would peel off, resulting in that light detection defects due to peeling-off of the bias line can be decreased, as compared with a case where no electrode opening is provided.

The first producing method may be further characterized in that, in the step of forming the second electrode, a transparent conductive film as the second electrode is formed on the photoelectric conversion layer, resist is applied over the transparent conductive film and patterning is carried out, and thereafter, an ashing treatment is carried out so as to remove the resist; and the ashing treatment causes the protection film at a bottom of the electrode portion of the second electrode having the electrode opening to be recessed toward an inner side of the electrode portion of the second electrode (the second producing method).

According to the second producing method, in the step of forming the second electrode, when resist is removed, an ashing treatment is carried out. The ashing treatment causes the bias line to be in contact also with a recessed portion of the protection film at the bottom of the electrode portion of the second electrode having the electrode opening. This allows the contact area where the bias line and the electrode portion of the second electrode as well as the protection film are in contact with each other to increase, thereby improving the adhesiveness of the bias line.

The following description describes embodiments of the present invention in detail, while referring to the drawings. Identical or equivalent parts in the drawings are denoted by the same reference numerals, and the descriptions of the same are not repeated.

Embodiment 1

(Configuration)

FIG. 1 schematically shows an X-ray imaging device in the present embodiment. The X-ray imaging device 100 includes an active matrix substrate 1 and a control unit 2. The control unit 2 includes a gate control unit 2A and a signal reading unit 2B. X-rays are projected from the X-ray source 3 to an object S, and X-rays transmitted through the object S are converted into fluorescence (hereinafter referred to as scintillation light) by a scintillator 4 provided above the active matrix substrate 1. The X-ray imaging device 100 picks up the scintillation light with the active matrix substrate 1 and the control unit 2, thereby acquiring an X-ray image.

Figure 2:
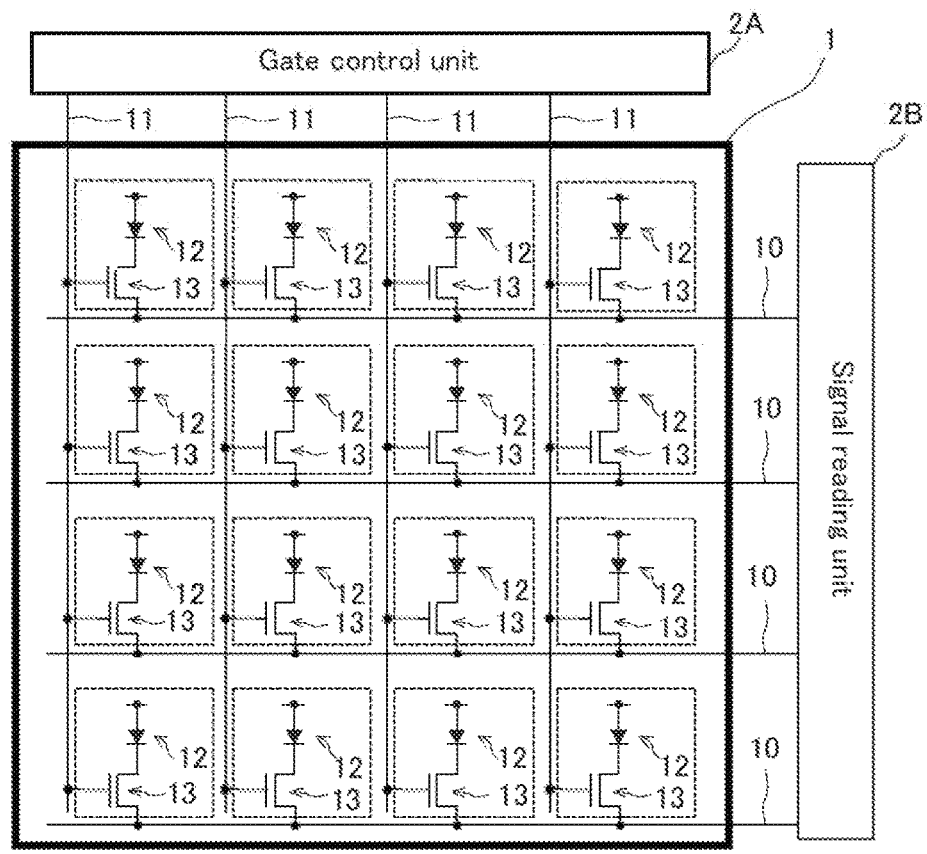
FIG. 2 schematically shows a schematic configuration of the imaging panel illustrated in FIG. 1.

FIG. 2 is a schematic diagram showing a schematic configuration of the active matrix substrate 1. As shown in FIG. 2, a plurality of source lines 10, and a plurality of gate lines 11 intersecting with the source lines 10 are formed in the active matrix substrate 1. The gate lines 11 are connected with the gate control unit 2A, and the source lines 10 are connected with the signal reading unit 2B.

The active matrix substrate 1 includes TFTs 13 connected to the source lines 10 and the gate lines 11, at positions at which the source lines 10 and the gate lines 11 intersect. Further, photodiodes 12 are provided in areas surrounded by the source lines 10 and the gate lines 11 (hereinafter referred to as pixels). In each pixel, scintillation light obtained by converting X-rays transmitted through the object S is converted by the photodiode 12 into charges according to the amount of the light. In other words, the pixels are detection units that detect scintillation light.

The gate lines 11 in the active matrix substrate 1 are sequentially switched by the gate control unit 2A into a selected state, and the TFT 13 connected to the gate line 11 in the selected state is turned ON. When the TFT 13 is turned ON, a signal according to the charges obtained by the conversion by the photodiode 12 is output through the source line 10 to the signal reading unit 2B.

Figure 3:
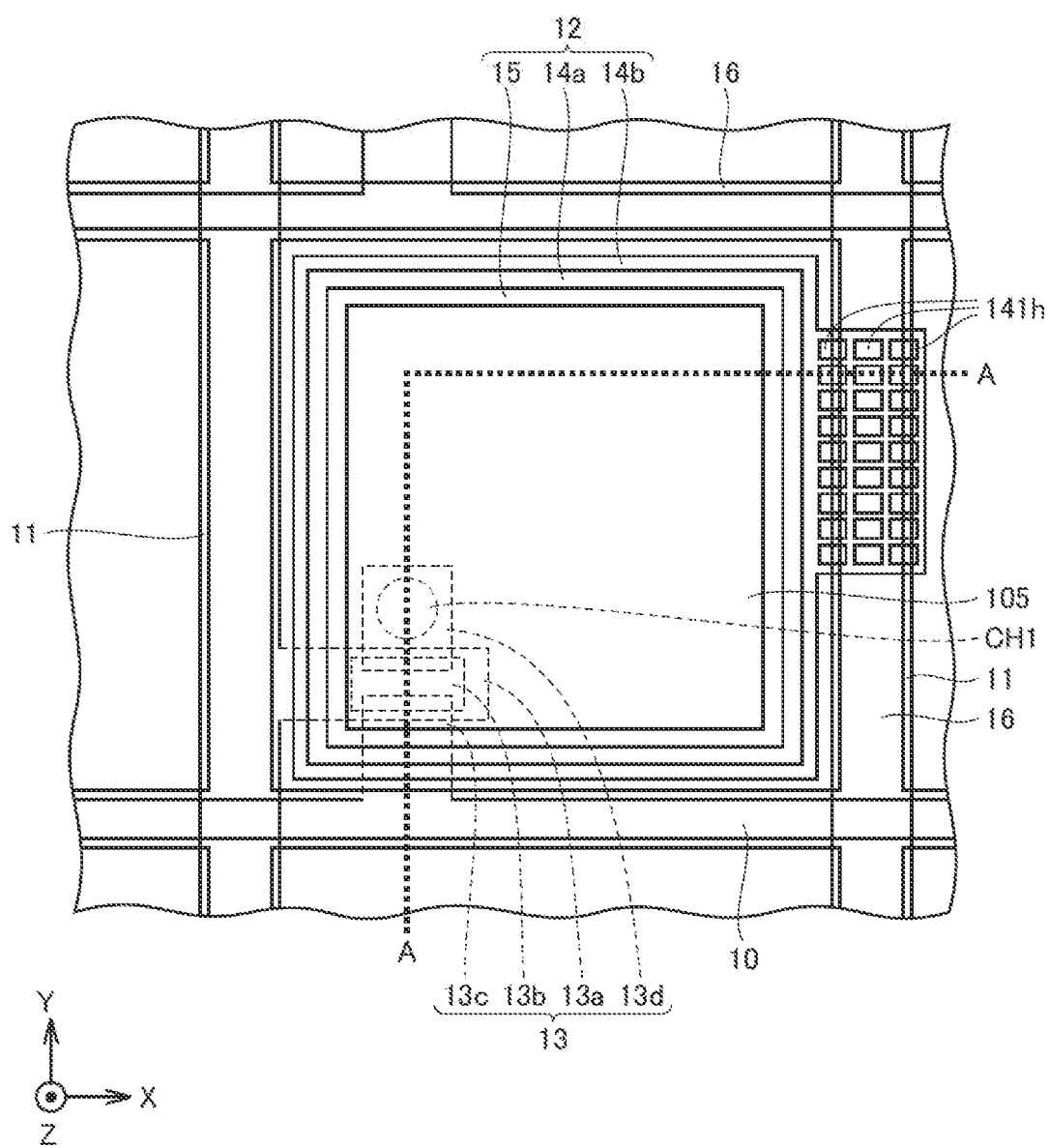
FIG. 3 is an enlarged plan view showing one pixel portion of the imaging panel illustrated in FIG. 2.

FIG. 3 is an enlarged plan view of one pixel portion of the active matrix substrate 1 illustrated in FIG. 2. As illustrated in FIG. 3, in the pixel surrounded by the gate lines 11 and the source lines 10, the photodiode 12 and the TFT 13 are arranged.

The photodiode 12 includes a lower electrode 14a and an upper electrode 14b as a pair of a first electrode and a second electrode, and a photoelectric conversion layer 15.

The upper electrode 14b is provided on the photoelectric conversion layer 15, that is, on a side that is irradiated with X-rays from the X-ray source 3 (see FIG. 1). The upper electrode 14b has a plurality of openings 141h (hereinafter referred to as electrode openings) each of which is in a rectangular shape, in an electrode portion that overlaps with the bias line 16.

The TFT 13 includes a gate electrode 13a integrated with the gate line 11, a semiconductor active layer 13b, a source electrode 13c integrated with the source line 10, and a drain electrode 13d.

Further, the bias line 16 is arranged so as to overlap with the gate line 11 and the source line 10 when viewed in a plan view. The bias line 16 supplies a bias voltage to the photodiode 12.

Figure 4:
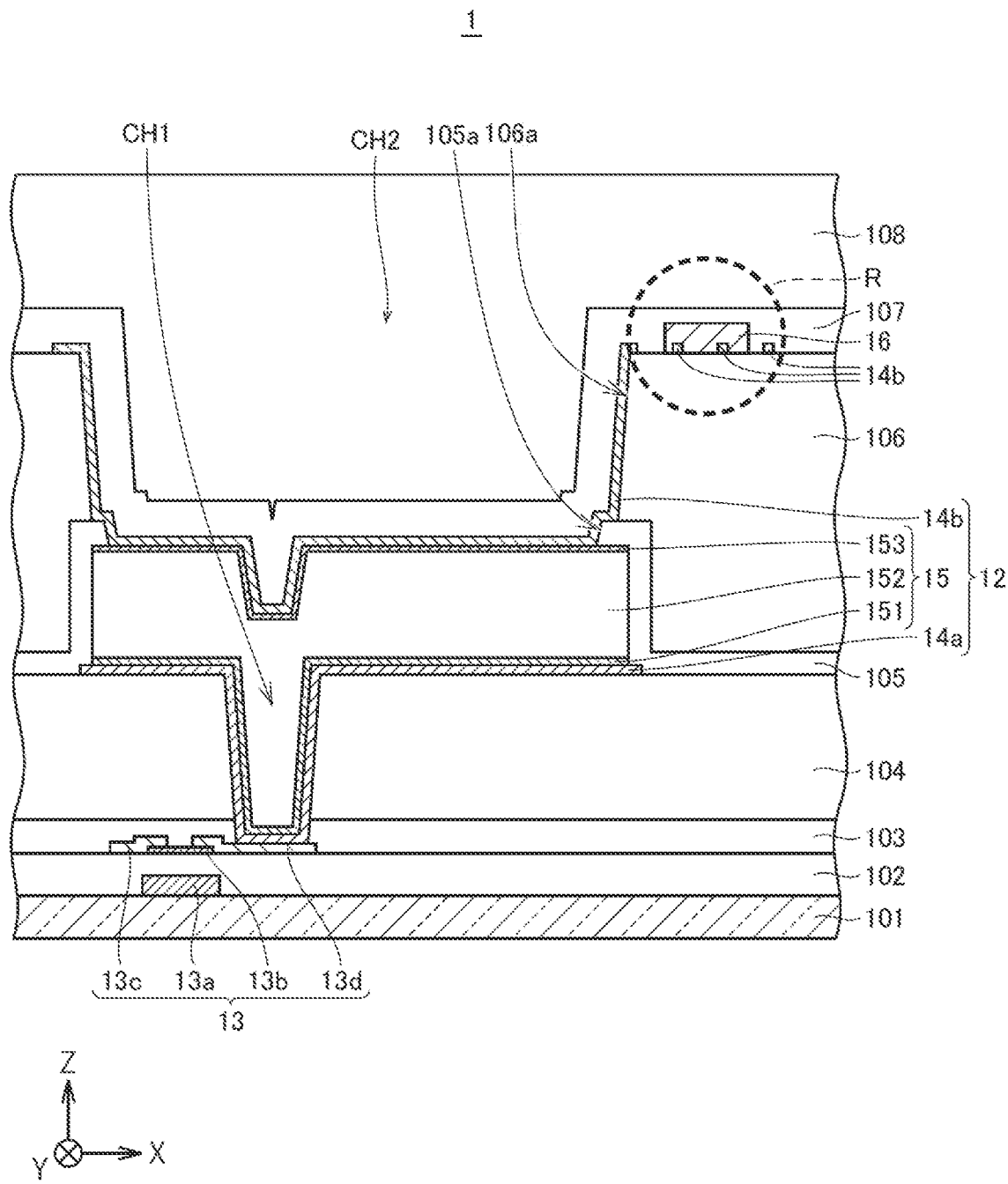
FIG. 4 is a cross-sectional view taken along line A-A of the pixel shown in FIG. 3.

Here, FIG. 4 shows a cross-sectional view of the pixel shown in FIG. 3 taken along line A-A. As shown in FIG. 4, each element in the pixel is arranged on the substrate 101. The substrate 101 is a substrate having insulating properties, and is formed with, for example, a glass substrate.

On the substrate 101, the gate electrode 13a integrated with the gate line 11 (see FIG. 3), and a gate insulating film 102.

The gate electrode 13a and the gate line 11 are made of, for example, a metal such as aluminum (Al), tungsten (W), molybdenum (Mo), molybdenum nitride (MoN), tantalum (Ta), chromium (Cr), titanium (Ti), or copper (Cu), an alloy of any of these metals, or a metal nitride of these metals. In the present example, the gate electrode 13a and the gate line 11 may have a laminate structure in which a metal film made of molybdenum nitride and a metal film made of aluminum are laminated in this order. In this case, regarding thicknesses of these metal films, it is preferable that the metal film made of molybdenum nitride has a thickness of about 100 nm, and the metal film made of aluminum has a thickness of about 300 nm. The materials and the thicknesses of the gate electrode 13a and the gate line 11, however, are not limited to these.

The gate insulating film 102 covers the gate electrode 13a. For forming the gate insulating film 102, for example, the following can be used: silicon oxide ($SiO_x$); silicon nitride ($SiN_x$); silicon oxide nitride ($SiO_xN_y$)(x>y); or silicon nitride oxide ($SiN_xO_y$)(x>y).

In this example, the gate insulating film 102 may be formed with a laminate film obtained by laminating silicon oxide ($SiO_x$) and silicon nitride ($SiN_x$) in the order. In this case, regarding the thicknesses of these films, it is preferable that the film of silicon oxide ($SiO_x$) has a thickness of about 50 nm, and the film of silicon nitride ($SiN_x$) has a thickness of about 400 nm. The material and the thickness of the gate insulating film 102, however, are not limited to these.

The semiconductor active layer 13b, as well as the source electrode 13c and the drain electrode 13d connected with the semiconductor active layer 13b are formed on the gate electrode 13a with the gate insulating film 102 being interposed therebetween.

The semiconductor active layer 13b is formed in contact with the gate insulating film 102. The semiconductor active layer 13b is made of an oxide semiconductor. For forming the oxide semiconductor, for example, the following material may be used: $InGaO_3(ZnO)_5$; magnesium zinc oxide ($Mg_xZn_{1-x}O$); cadmium zinc oxide ($Cd_xZn_{1-x}O$); cadmium oxide (CdO); or an amorphous oxide semiconductor containing indium (In), gallium (Ga), and zinc (Zn) at a predetermined ratio.

In this example, it is preferable that the semiconductor active layer 13b is made of, for example, an amorphous oxide semiconductor containing indium (In), gallium (Ga), and zinc (Zn) at a predetermined ratio, and has a thickness of about 70 nm. The material and the thickness of the semiconductor active layer 13b, however, are not limited to these.

The source electrode 13c and the drain electrode 13d, on the gate insulating film 102, are arranged so as to be in contact with parts of the semiconductor active layer 13b. The drain electrode 13d is connected with the lower electrode 14a through the contact hole CH1.

The source electrode 13c and the drain electrode 13d are formed in the same layer, and are made of, for example, a metal such as aluminum (Al), tungsten (W), molybdenum (Mo), tantalum (Ta), chromium (Cr), titanium (Ti), or copper (Cu), or alternatively, an alloy of any of these, of a metal nitride of any of these. Further, as the material for the source electrode 13c and the drain electrode 13d, the following material may be used: a material having translucency such as indium tin oxide (ITO), indium zinc oxide (IZO), indium tin oxide (ITSO) containing silicon oxide, indium oxide ($In_2O_3$), tin oxide ($SnO_2$), zinc oxide (ZnO), or titanium nitride; or a material obtained by appropriately combining any of these.

In this example, the source electrode 13c and the drain electrode 13d has a laminate structure obtained by laminating a plurality of metal films. More specifically, the source electrode 13c and the drain electrode 13d are formed with a metal film made of molybdenum nitride (MoN), a metal film made of aluminum (Al), and a metal film made of molybdenum nitride (MoN) which are laminated in this order. In this case, regarding the thicknesses of the films, preferably, the metal film in the lower layer, which is made of molybdenum nitride (MoN), has a thickness of about 100 nm, the metal film made of aluminum (Al) has a thickness of about 500 nm, and the metal film in the upper layer, which is made of molybdenum nitride (MoN), has a thickness of about 50 nm. The materials and the thicknesses of the source electrode 13c and the drain electrode 13d, however, are not limited to these.

A first insulating film 103 covers the source electrode 13c and the drain electrode 13d. In this example, the first insulating film 103 has a laminate structure obtained by laminating silicon nitride (SiN) and silicon oxide ($SiO_2$) in this order. In this case, it is preferable that, for example, the silicon nitride (SiN) film has a thickness of about 330 nm, and the silicon oxide ($SiO_2$) film has a thickness of about 200 nm. The material and the thickness of the first insulating film 103, however, are not limited to these. Further, the first insulating film 103 may have a single layer structure made of silicon oxide ($SiO_2$) or silicon nitride (SiN).

On the first insulating film 103, a second insulating film 104 is formed. On the drain electrode 13d, the contact hole CH1 is formed. The contact hole CH1 passes through the second insulating film 104 and the first insulating film 103. In this example, the second insulating film 104 is formed with an organic transparent resin such as acrylic resin or siloxane-based resin. In this case, the second insulating film 104 preferably has a thickness of about 2.5 μm. The thickness of the second insulating film 104, however, is not limited to this.

On the second insulating film 104, the lower electrode 14a is formed. The lower electrode 14a is connected with the drain electrode 13d through the contact hole CH1. In this example, the lower electrode 14a is formed with, for example, a metal film containing molybdenum nitride (MoN). In this case, the lower electrode 14a preferably has a thickness of about 200 nm. The material and the thickness of the lower electrode 14a, however, are not limited to these.

On the lower electrode 14a, the photoelectric conversion layer 15 is formed. The photoelectric conversion layer 15 is composed of the n-type amorphous semiconductor layer 151, the intrinsic amorphous semiconductor layer 152, and the p-type amorphous semiconductor layer 153, which are laminated in the order. In this example, the photoelectric conversion layer 15 has an X-axis-direction length shorter than the X-axis-direction length of the lower electrode 14a.

The n-type amorphous semiconductor layer 151 is made of amorphous silicon doped with an n-type impurity (for example, phosphorus). In this example, the n-type amorphous semiconductor layer 151 preferably has a thickness of about 30 nm. The dopant material and the thickness of the n-type amorphous semiconductor layer 151, however, are not limited to these.

The intrinsic amorphous semiconductor layer 152 is made of intrinsic amorphous silicon. The intrinsic amorphous semiconductor layer 152 is formed in contact with the n-type amorphous semiconductor layer 151. In this example, the intrinsic amorphous semiconductor layer preferably has a thickness of about 1000 nm, but the thickness thereof is not limited to this.

The p-type amorphous semiconductor layer 153 is made of amorphous silicon doped with a p-type impurity (for example, boron). The p-type amorphous semiconductor layer 153 is formed in contact with the intrinsic amorphous semiconductor layer 152. In this example, the p-type amorphous semiconductor layer 153 preferably has a thickness of about 5 nm. The dopant material and the thickness of the p-type amorphous semiconductor layer 153, however, are not limited to these.

On the second insulating film 104, the third insulating film 105 is provided. The third insulating film 105 covers the side surfaces of the lower electrode 14a and the photoelectric conversion layer 15, and has an opening 105a above the photoelectric conversion layer 15. In this example, the third insulating film 105 is an inorganic insulating film made of, for example, silicon nitride (SiN). The third insulating film 105 preferably has a thickness of about preferably has a thickness of 300 nm. The material and the thickness of the third insulating film 105 are not limited to these.

On the third insulating film 105, the fourth insulating film 106 is provided. The fourth insulating film 106 has an opening 106a on the opening 105a of the third insulating film 105, the opening 106a having a greater width than the width of the opening 105a. The fourth insulating film 106 overlaps with the side surfaces of the photoelectric conversion layer 15 when viewed in a plan view. In other words, the fourth insulating film 106 covers the side surfaces of the photoelectric conversion layer 15 with the third insulating film 105 being interposed between the fourth insulating film 106 and the photoelectric conversion layer 15. The openings 105a and 106a compose a contact hole CH2. In this example, the fourth insulating film 106 is an organic insulating film made of, for example, acrylic resin or siloxane-based resin. The fourth insulating film 106 preferably has a thickness of about 2.5 μm. The material and the thickness of the fourth insulating film 106, however, are not limited to these.

The upper electrode 14b is formed on the fourth insulating film 106 so as to be in contact with the photoelectric conversion layer 15 in the contact hole CH2. Further, the bias line 16 is provided outside the photoelectric conversion layer 15, on the fourth insulating film 106. One of ends of the upper electrode 14b reaches at least to a position at which the bias line 16 is provided, and is connected with the bias line 16. The bias line 16 is connected to the control unit 2 (see FIG. 1). The bias line 16 applies a bias voltage input from the control unit 2, to the upper electrode 14b, through the contact hole CH2.

The upper electrode 14b is formed with a transparent conductive film, and in this example, it is made of indium tin oxide (ITO). The upper electrode 14b preferably has a thickness of about 70 nm. The material and the thickness of the upper electrode 14b, however, are not limited to these.

The bias line 16 is formed with a metal film. In this example, the bias line 16 has a laminate structure that is obtained by laminating, for example, a metal film made of molybdenum nitride (MoN), a metal film made of aluminum (Al), and a metal film made of titanium (Ti) in this order. In this case, the films of molybdenum nitride (MoN), aluminum (Al), and titanium (Ti) preferably have thicknesses of about 100 nm, 300 nm, and 50 nm, respectively. The material and the thickness of the bias line 16, however, are not limited to these.

Figure 5:
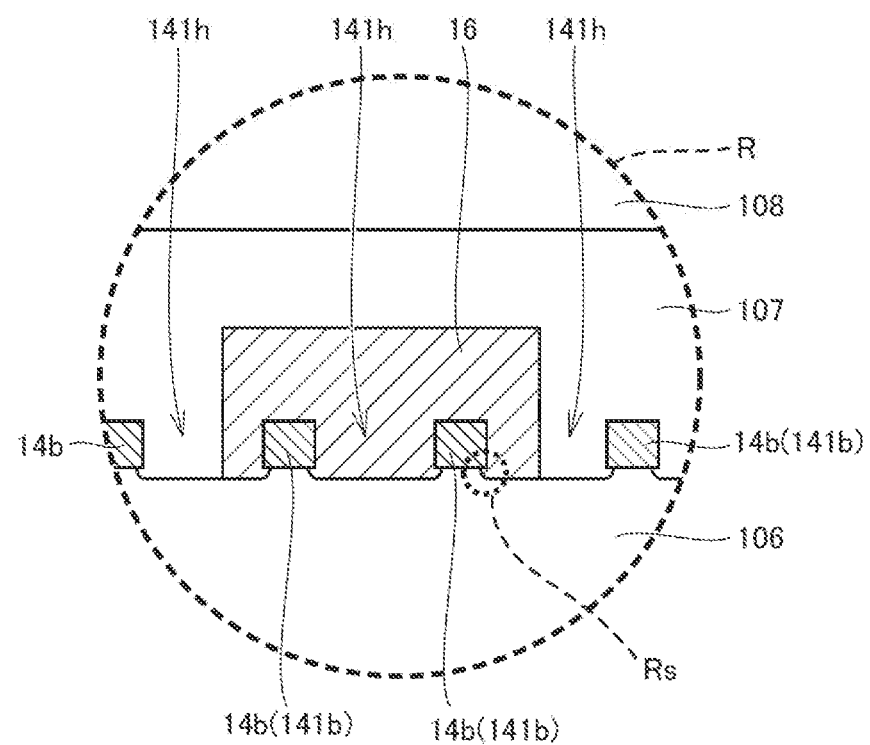
FIG. 5 is an enlarged view showing a portion in the broken-line frame in FIG. 4.

Here, FIG. 5 shows an enlarged view of the broken-line frame R shown in FIG. 4. As shown in FIG. 5, in the upper electrode 14b, an electrode portion overlapping with the bias line 16 has a plurality of rectangular electrode openings 141h arranged in a lattice form. Further, as indicated by the broken line frame Rs, the fourth insulating film 106, under partial electrodes 141b of the upper electrode 14b adjacent to the electrode openings 141h, is recessed toward the inside of each partial electrode 141b, whereby each partial electrode 141b has an eave-like shape. Further, the surface of the fourth insulating film 106 in each electrode opening 141h is lower with respect to the bottom surface of the partial electrode 141b.

As described above, the upper electrode 14b is formed with a transparent conductive film, and the bias line 16 is formed with a metal film. The electrode portion of the upper electrode 14b overlapping with the bias line 16 is provided with a plurality of the electrode openings 141h, and the bias line 16 is in contact with, not only the partial electrodes 141b, but also the fourth insulating film 106 in the electrode openings 141h. The adhesiveness of the bias line 16 is therefore improved, as compared with a case where the upper electrode 14b is not provided with the electrode openings 141h, and the bias line 16 is in contact with only the upper electrode 14b. Further, the fourth insulating film 106, under the partial electrodes 141b adjacent to the electrode openings 141h, is recessed toward the inside of each partial electrode 141b. The contact area between the bias line 16 and the fourth insulating film 106 therefore increases, as compared with a case where the surface of the fourth insulating film 106 is flat, and in the recesses in the fourth insulating film 106, the bias line 16 and the partial electrodes 141b are in contact with each other, whereby the adhesiveness of the bias line 16 can be further improved.

Still further, in the present embodiment, the bias line 16 formed with a metal film is provided on the outer side with respect to the photoelectric conversion layer 15, and is connected with the partial electrodes 141b of the upper electrode 14b. The transmittance of each pixel therefore does not decrease, whereby it is unlikely that the quantum efficiency would decrease, as compared with a case where the bias line 16 and the upper electrode 14b are connected with each other above the photoelectric conversion layer.

Referring back to FIG. 4, a fifth insulating film 107 covers the upper electrode 14b, the fourth insulating film 106, and the bias line 16. The fifth insulating film 107 is an inorganic insulating film, and in this example, it is made of silicon nitride (SiN). In this case, the fifth insulating film 107 preferably has a thickness of about 200 nm. The material and the thickness of the fifth insulating film 107, however, are not limited to these.

A sixth insulating film 108 covers the fifth insulating film 107. The sixth insulating film 108 is an organic insulating film, and in this example, it is made of an organic transparent resin such as acrylic resin or siloxane-based resin. The sixth insulating film 108 preferably has a thickness of about 2.0

µm. The material and the thickness of the sixth insulating film 108, however, are not limited to these.

(Method for Producing Active Matrix Substrate 1)

Figure 6A:
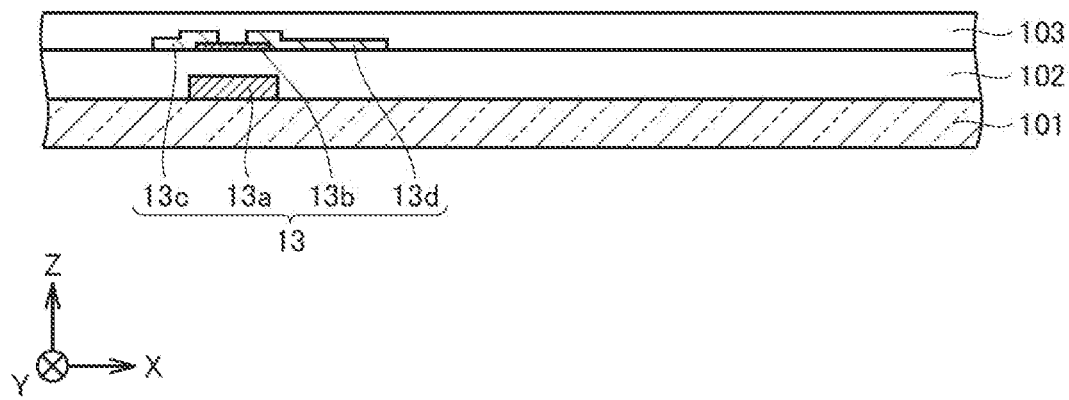
FIG. 6A is a cross-sectional view showing a step in a process for producing the imaging panel shown in FIG. 4, the step being a step of forming a first insulating film, in a state in which a gate insulating film and a TFT are formed on a substrate.
Figure 6B:
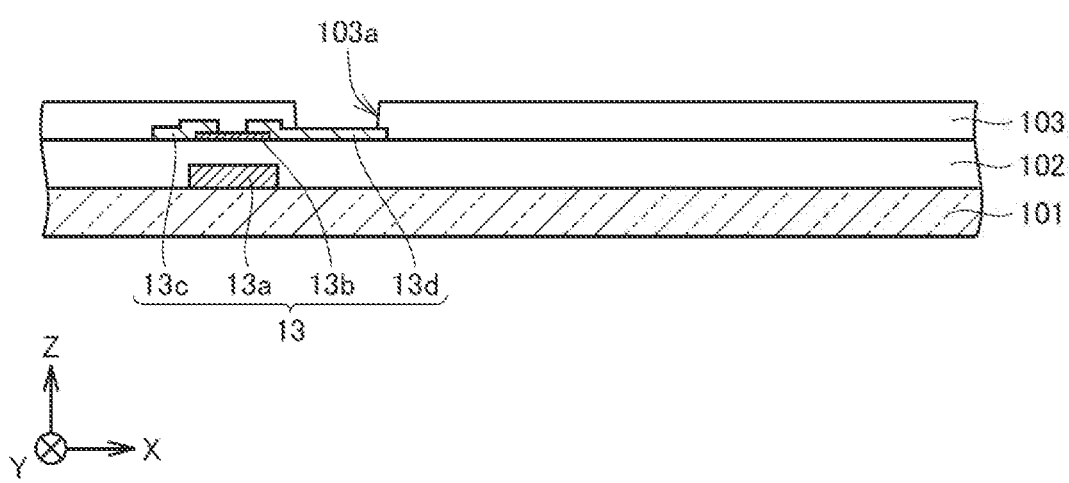
FIG. 6B is a cross-sectional view showing a step of patterning the first insulating film shown in FIG. 6A so as to form an opening in the first insulating film.

Next, the following description describes a method for producing the active matrix substrate 1. FIGS. 6A to 6R are cross-sectional views (taken along line A-A in FIG. 3) in respective steps of the method for producing the active matrix substrate 1.

As shown in FIG. 6A, the gate insulating film 102 and the TFT 13 are formed on the substrate 101 by using a known method, and the first insulating film 103 made of silicon nitride (SiN) is formed so as to cover the TFT 13 by using, for example, plasma CVD.

Subsequently, a heat treatment at about 350° C. is applied to an entire surface of the substrate 101, photolithography and wet etching are carried out so as to pattern the first insulating film 103, whereby the opening 103a is formed on the drain electrode 13d (see FIG. 6B).

Figure 6C:
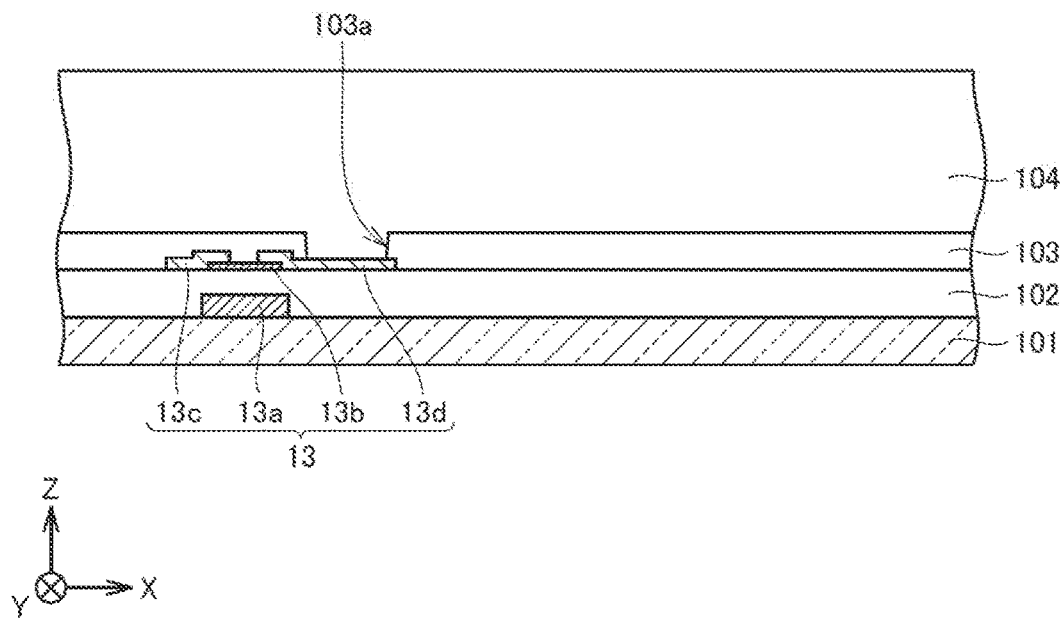
FIG. 6C is a cross-sectional view showing a step of forming the second insulating film illustrated in FIG. 4.

Next, the second insulating film 104 made of acrylic resin or siloxane-based resin is formed on the first insulating film 103 by using, for example, slit-coating (see FIG. 6C).

Figure 6D:
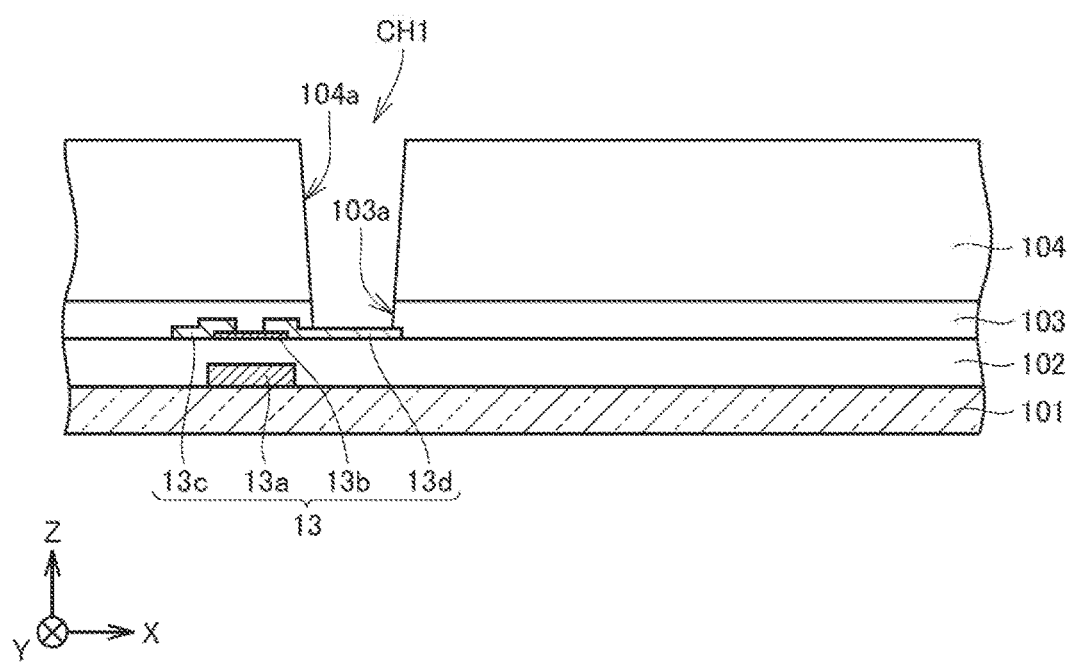
FIG. 6D is a cross-sectional view showing a step of patterning the second insulating film shown in FIG. 6C so as to form an opening in the second insulating film.

Then, the opening 104a in the second insulating film 104 is formed on the opening 103a by using photolithography. Through these steps, the contact hole CH1 composed of the openings 103a and 104a is formed (see FIG. 6D).

Figure 6E:
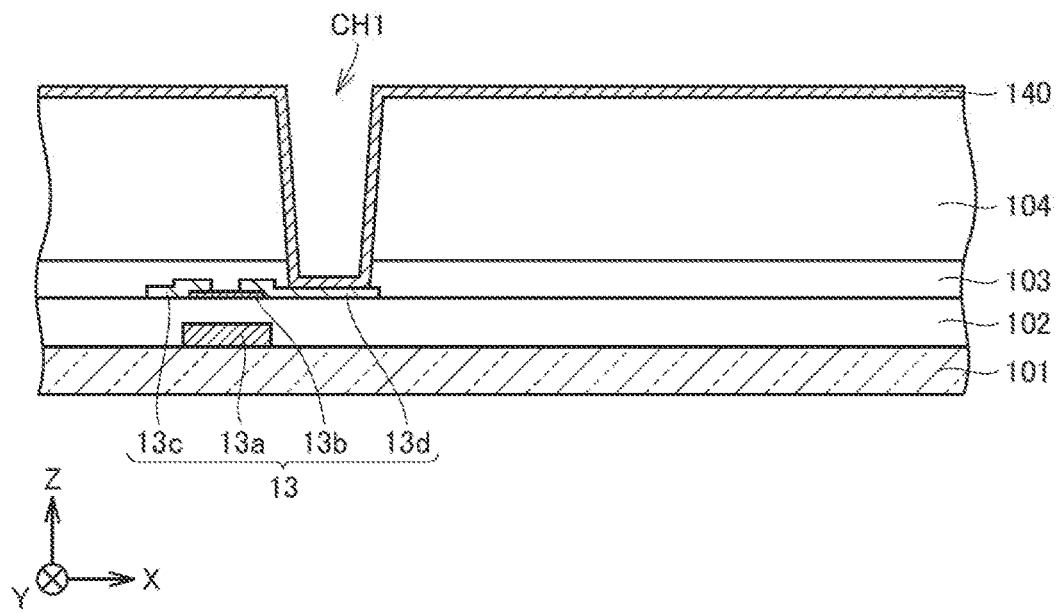
FIG. 6E is a cross-sectional view showing a step of forming a metal film as the lower electrode shown in FIG. 4.

Subsequently, the metal film 140 made of molybdenum nitride (MoN) is formed on the second insulating film 104 by using, for example, sputtering (see FIG. 6E).

Figure 6F:
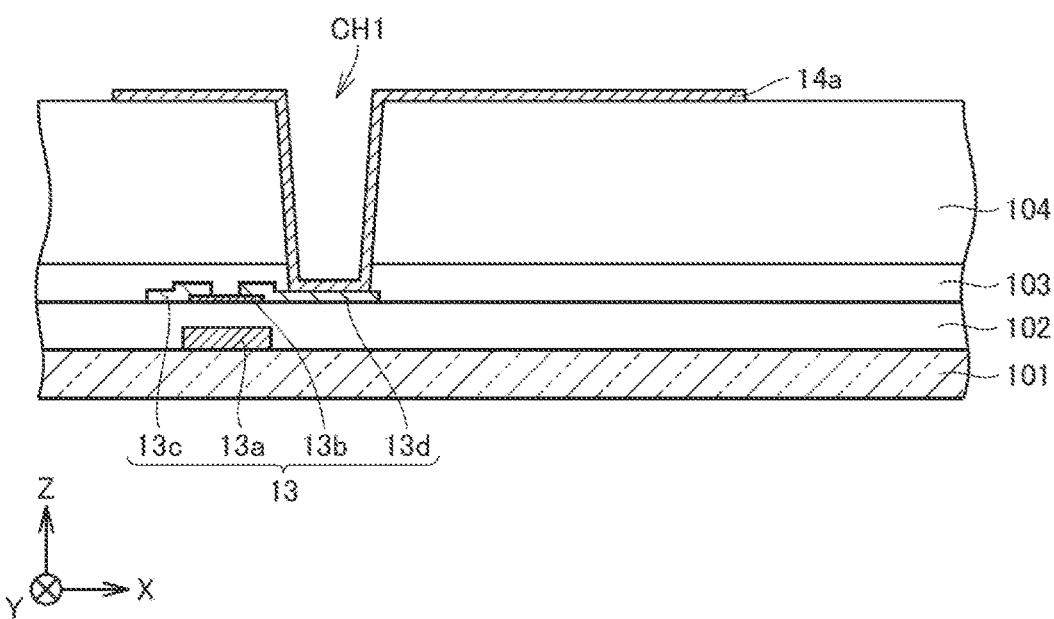
FIG. 6F is a cross-sectional view showing a step of patterning the metal film shown in FIG. 6E so as to form the lower electrode.

Then, photolithography and wet etching are carried out so as to pattern the metal film 140. As a result, the lower electrode 14a connected through the contact hole CH1 with the drain electrode 13d is formed on the second insulating film 104 (see FIG. 6F).

Figure 6G:
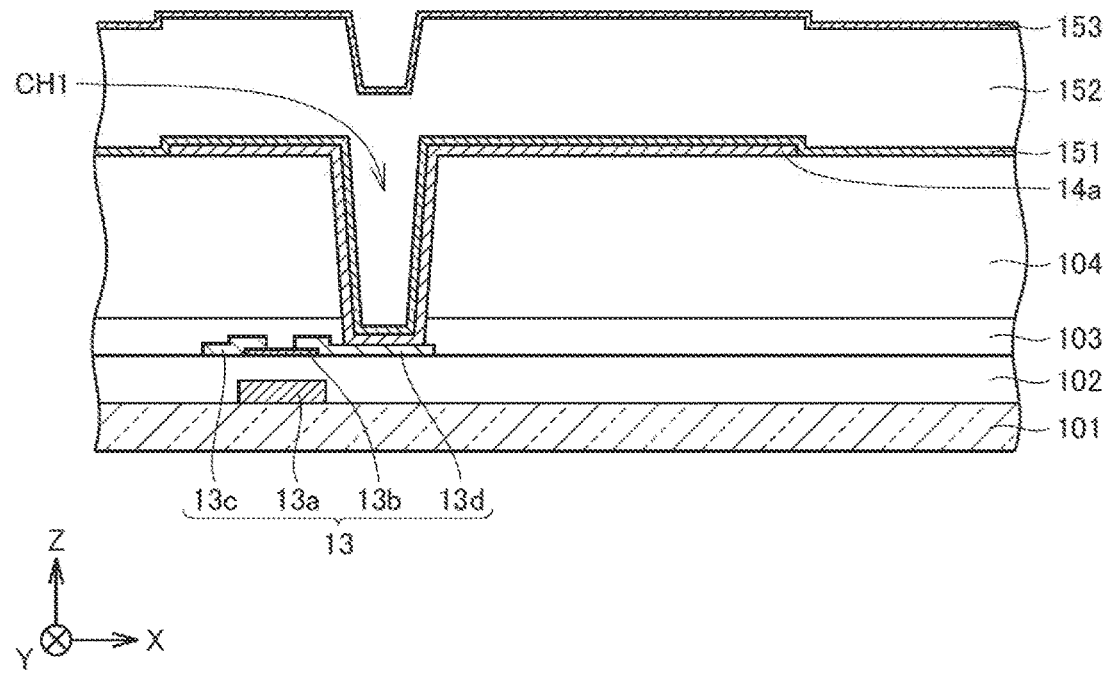
FIG. 6G is a cross-sectional view showing a step of forming an n-type amorphous semiconductor layer, an intrinsic amorphous semiconductor layer, and a p-type amorphous semiconductor layer as the photoelectric conversion layer shown in FIG. 4.

Next, the n-type amorphous semiconductor layer 151, the intrinsic amorphous semiconductor layer 152, and the p-type amorphous semiconductor layer 153 are formed in this order to cover the second insulating film 104 and the lower electrode 14a by using, for example, plasma CVD (see FIG. 6G).

Figure 6H:
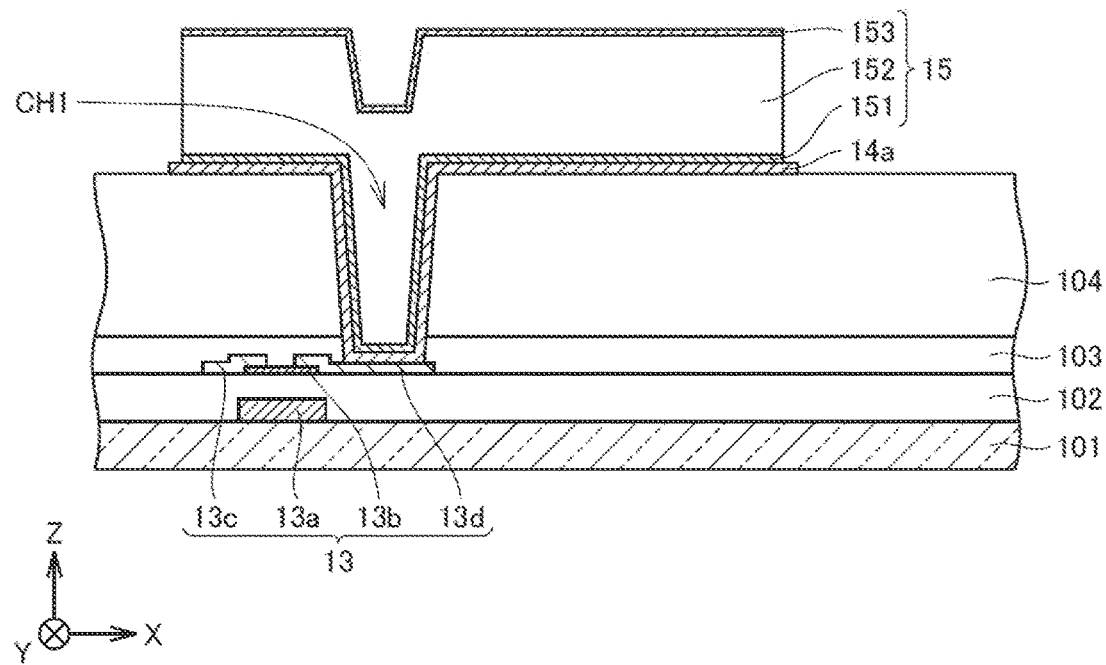
FIG. 6H is a cross-sectional view showing a step of patterning the n-type amorphous semiconductor layer, the intrinsic amorphous semiconductor layer, and the p-type amorphous semiconductor layer illustrated in FIG. 6G so as to form a photoelectric conversion layer.

Then, photolithography and dry etching are carried out, whereby the n-type amorphous semiconductor layer 151, the intrinsic amorphous semiconductor layer 152, and the p-type amorphous semiconductor layer 153 are patterned. As a result, the photoelectric conversion layer 15 is formed (see FIG. 6H).

Figure 6I:
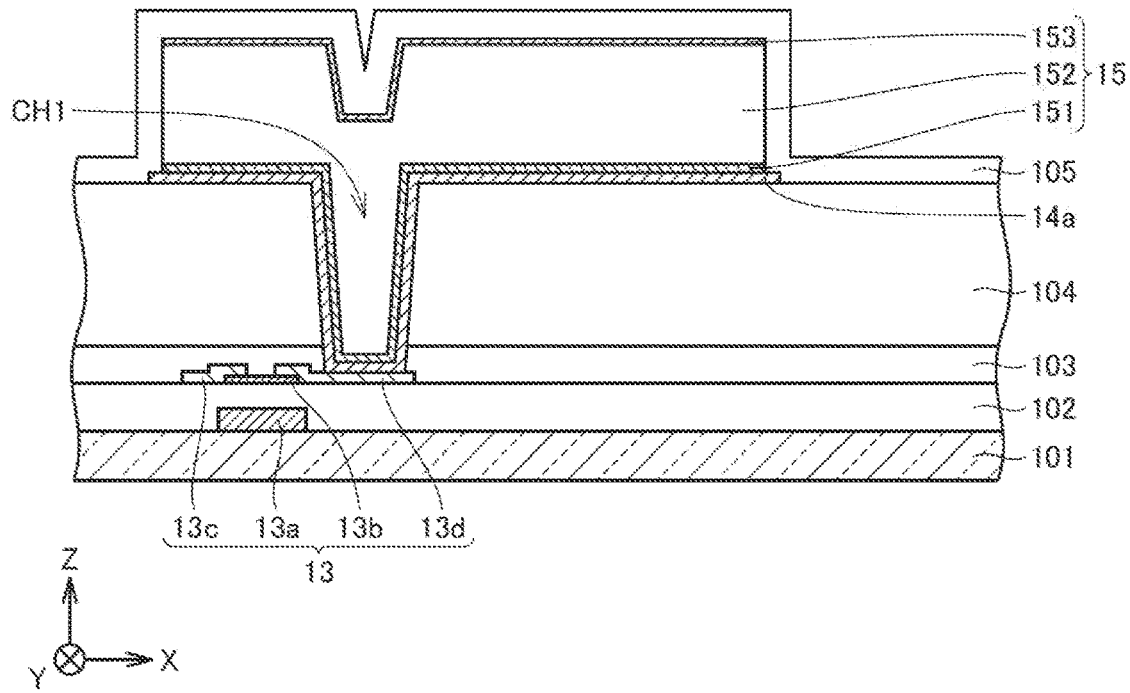
FIG. 6I is a cross-sectional view showing a step of forming the third insulating film shown in FIG. 4.

Next, the third insulating film 105 made of silicon nitride (SiN) is formed so as to cover the surface of the photoelectric conversion layer 15, by using, for example, plasma CVD (see FIG. 6I).

Figure 6J:
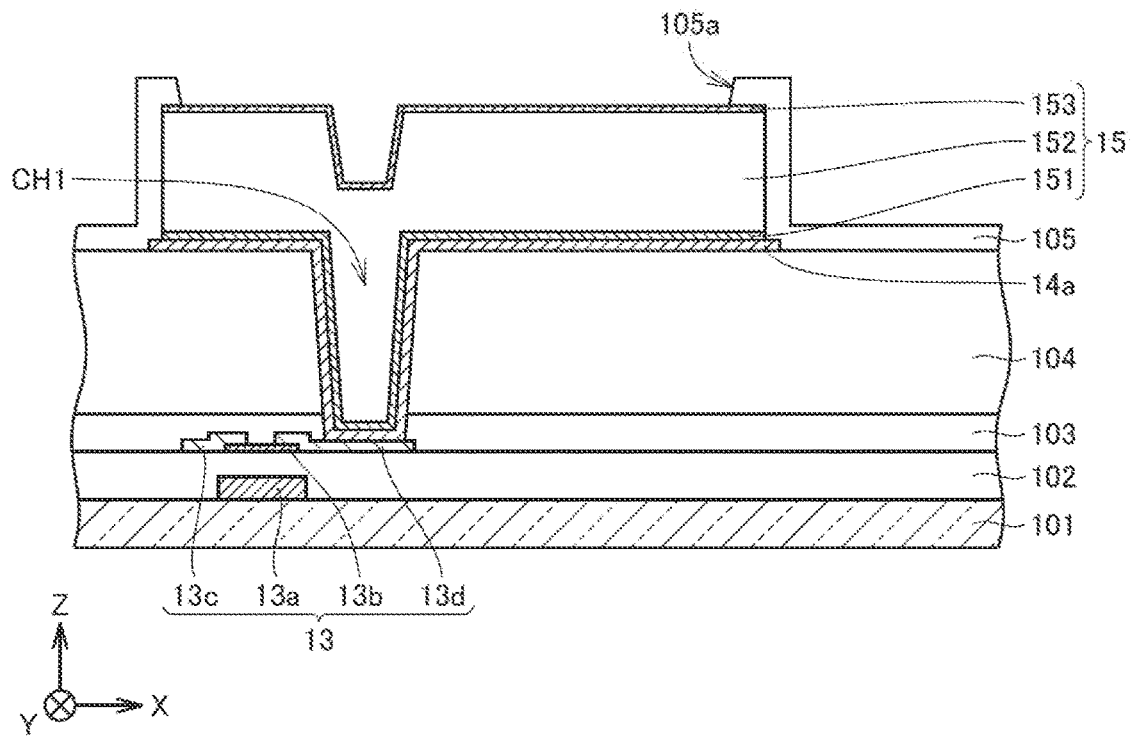
FIG. 6J is a cross-sectional view showing a step of patterning the third insulating film shown in FIG. 6I so as to form an opening in the third insulating film.

Then, photolithography and wet etching are carried out so as to pattern the third insulating film 105, whereby the opening 105a of the third insulating film 105 is formed on the photoelectric conversion layer 15 (see FIG. 6J). For this wet etching, for example, an etchant containing hydrofluoric acid is used.

Figure 6K:
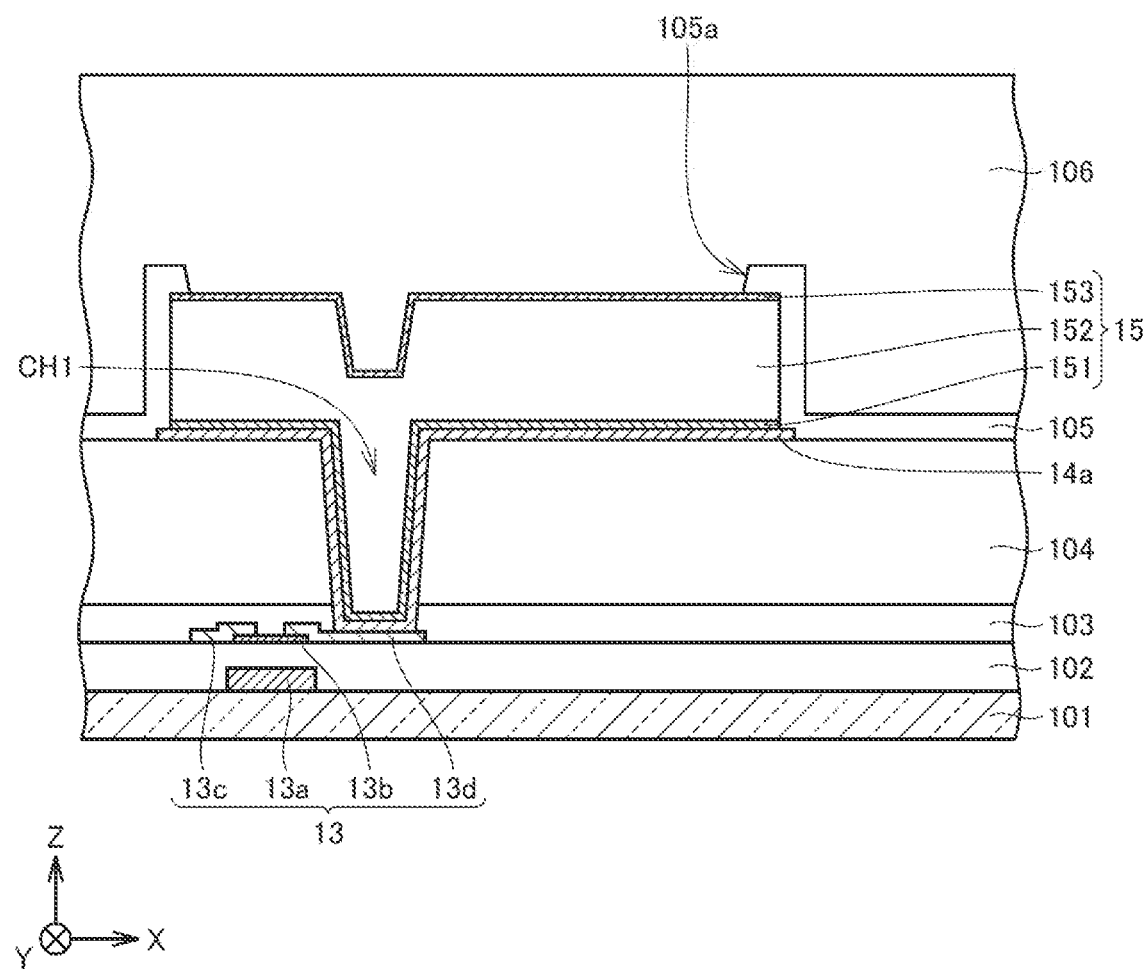
FIG. 6K is a cross-sectional view showing a step of forming the fourth insulating film shown in FIG. 4.

Subsequently, the fourth insulating film 106 made of acrylic resin or siloxane-based resin is formed on the third insulating film 105 by using, for example, slit-coating (see FIG. 6K). Thereafter, photolithography and wet etching are carried out, whereby the opening 106a of the fourth insulating film 106 is formed on the opening 105a of the third insulating film 105 (see FIG. 6L). The opening 106a of the fourth insulating film 106 has a width greater than that of the opening 105a of the third insulating film 105. Through these steps, the contact hole CH2 composed of the openings 105a and 106a is formed.

Figure 6M:
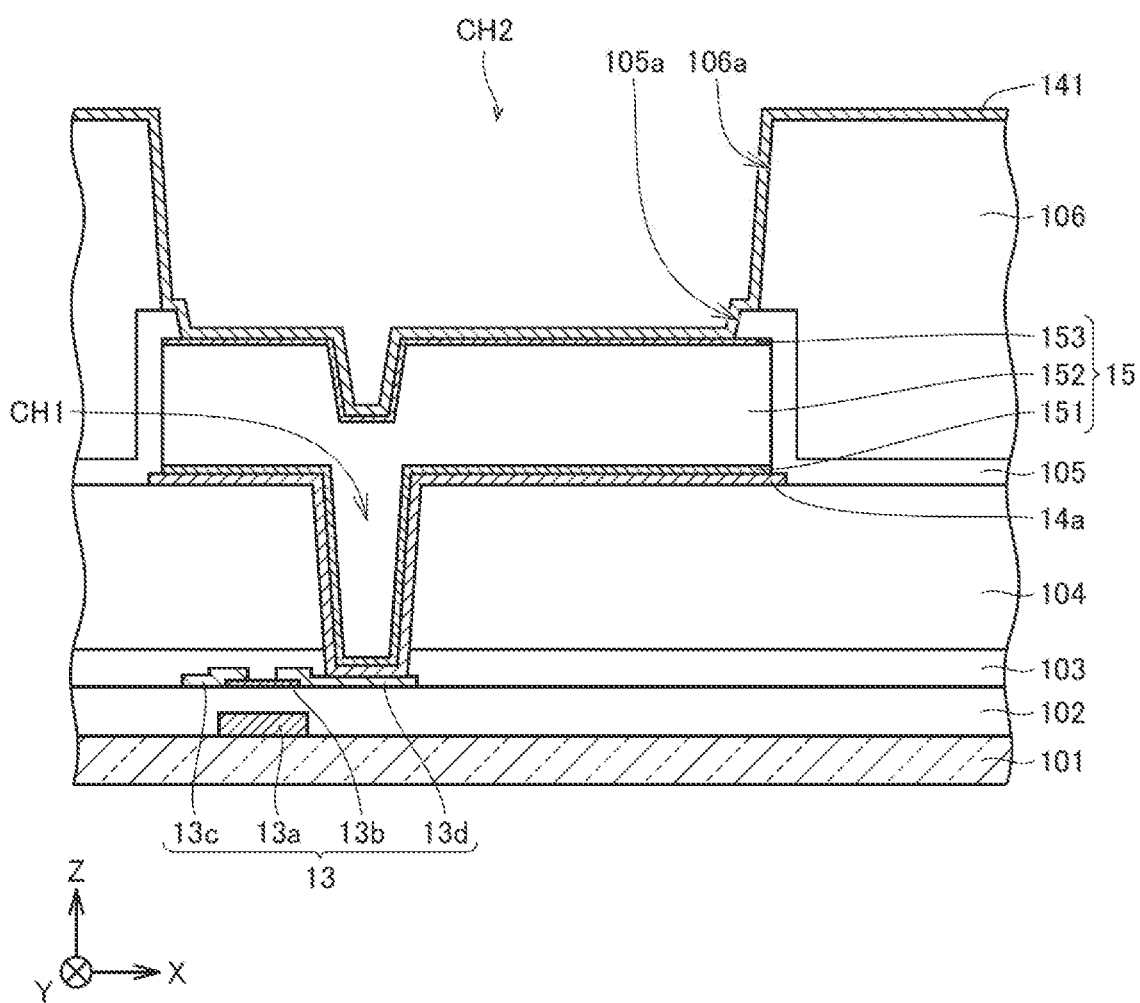
FIG. 6M is a cross-sectional view showing a step of forming a transparent conductive film as the upper electrode shown in FIG. 4.

Next, the transparent conductive film 141 made of ITO is formed on the fourth insulating film 106 by using, for example, sputtering so as to cover the p-type amorphous semiconductor layer 153 and the fourth insulating film 106 (see FIG. 6M).

Subsequently, photolithography and dry etching are carried out so as to pattern the transparent conductive film 141. Thereafter, an oxygen plasma ashing treatment using oxygen gas is carried out by using a dry etching device, and resist used for the above-described patterning is removed. Through these steps, on an outer side with respect to one end of the photoelectric conversion layer 15, the upper electrode 14b that has a plurality of electrode openings 141h and is connected with the photoelectric conversion layer 15 at the contact hole CH2 is formed. Besides, by the oxygen plasma ashing treatment, the fourth insulating film 106 has a smaller thickness at each electrode opening 141h (see FIG. 6N). In other words, as shown in FIG. 5, the fourth insulating film 106, under the partial electrodes 141b adjacent to the electrode openings 141h, is recessed, whereby the foregoing partial electrodes 141b protrude in eave-like shapes.

Figure 6O:
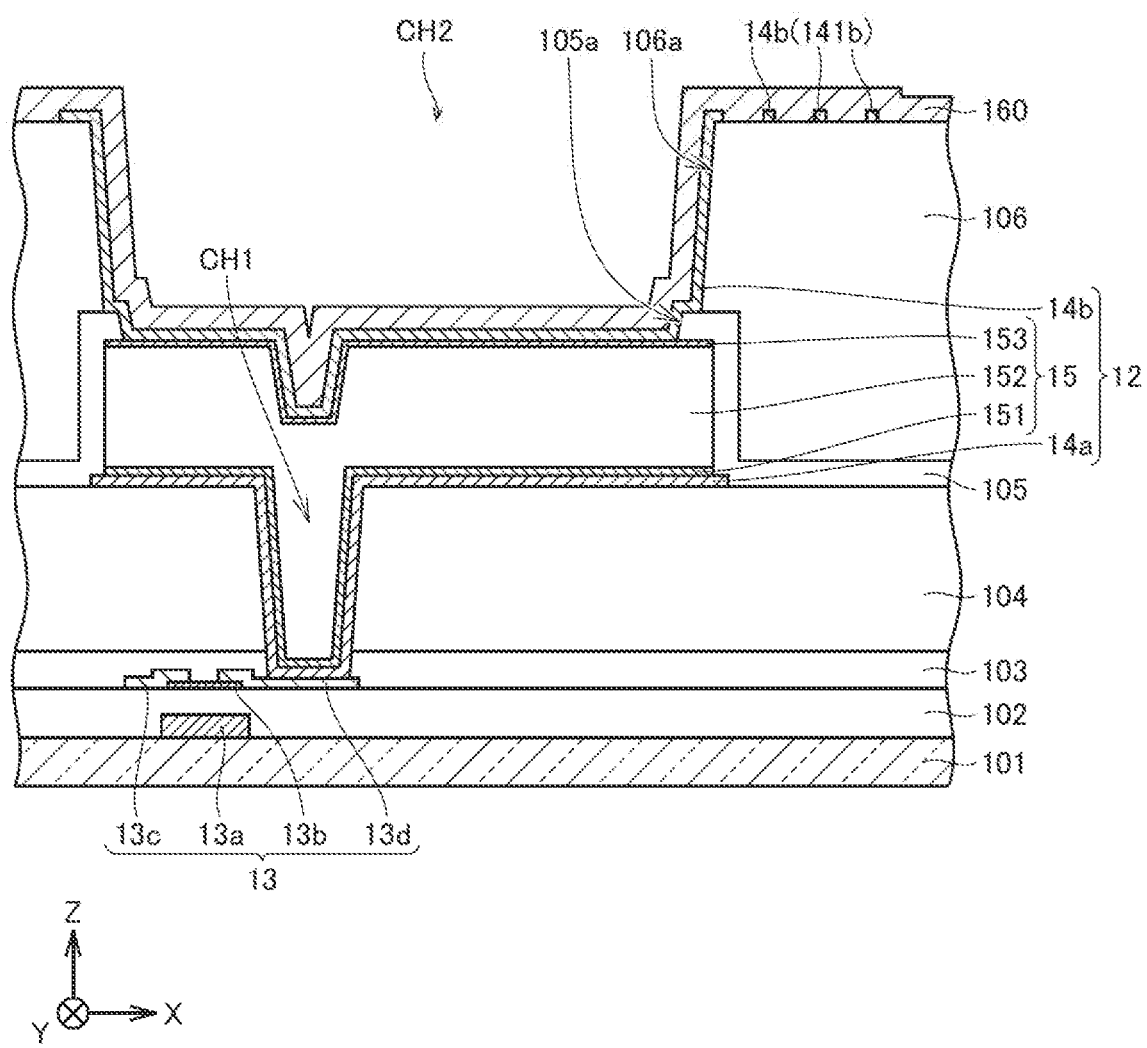
FIG. 6O is a cross-sectional view showing a step of forming a metal film as the bias line shown in FIG. 4.

Thereafter, the metal film 160 obtained by laminating molybdenum nitride (MoN), aluminum (Al), and titanium (Ti) in this order is formed on the fourth insulating film 106 by using, for example, sputtering so as to cover the upper electrode 14b (see FIG. 6O)

Figure 6P:
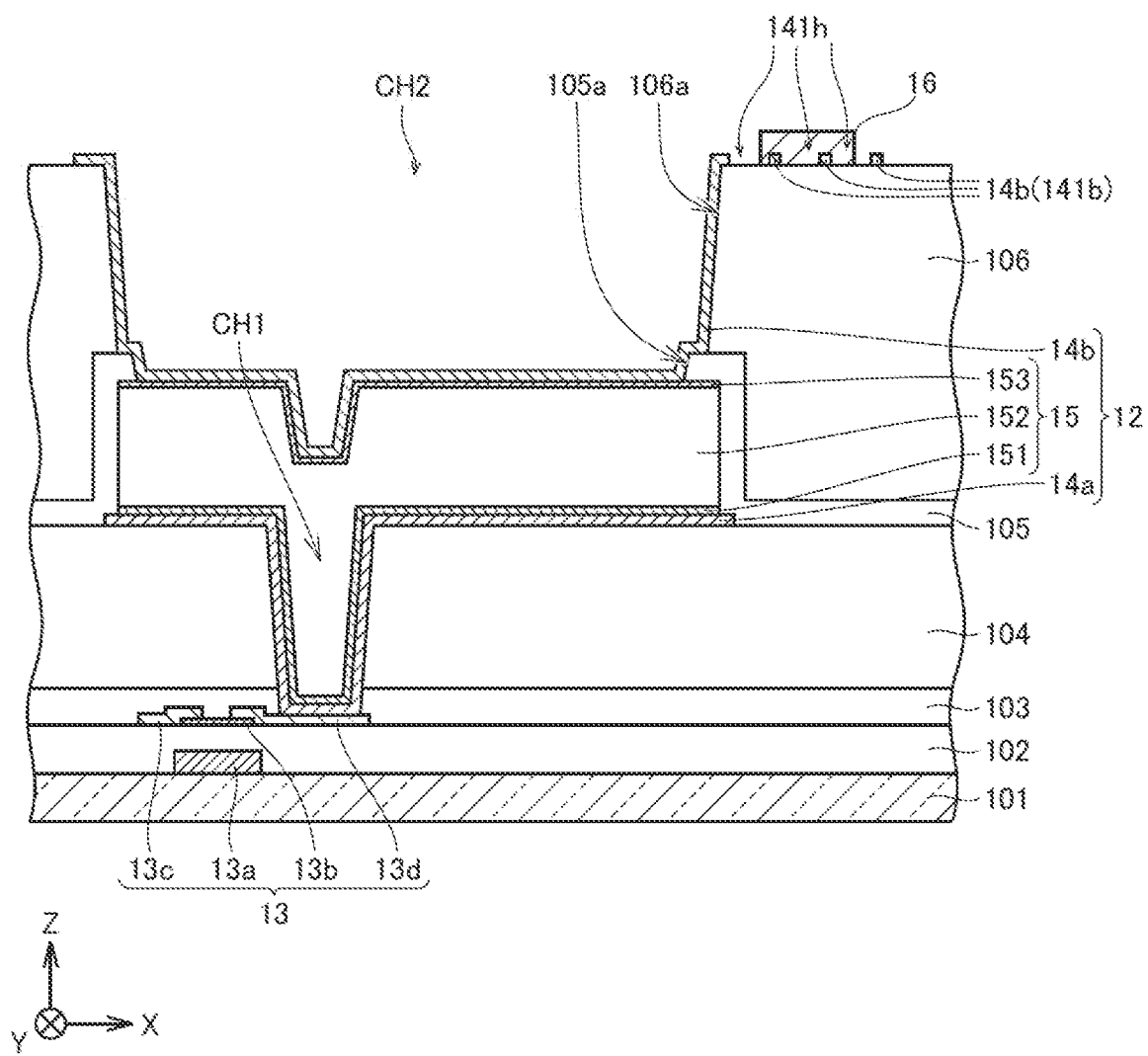
FIG. 6P is a cross-sectional view showing a step of patterning the metal film shown in FIG. 6O so as to form the bias line.

Then, photolithography and wet etching are carried out so as to pattern the metal film 160. Through these steps, on an outer side with respect to one end of the photoelectric conversion layer 15, the bias line 16 is formed at a position overlapping with the electrode openings 141h and the partial electrodes 141b of the upper electrode 14b (see FIG. 6P).

Figure 6Q:
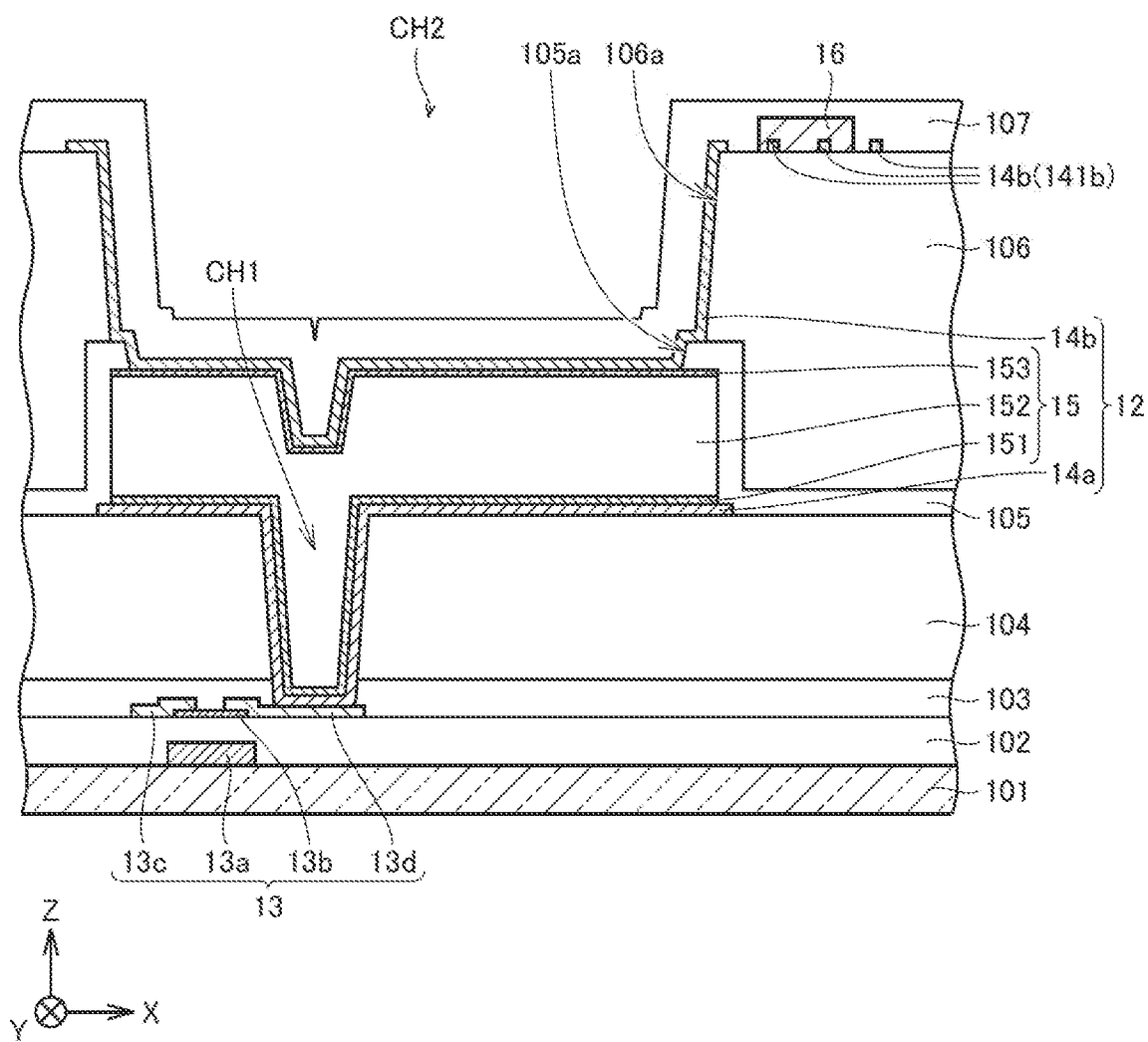
FIG. 6Q is a cross-sectional view showing a step of forming the fifth insulating film shown in FIG. 4.
Figure 6R:
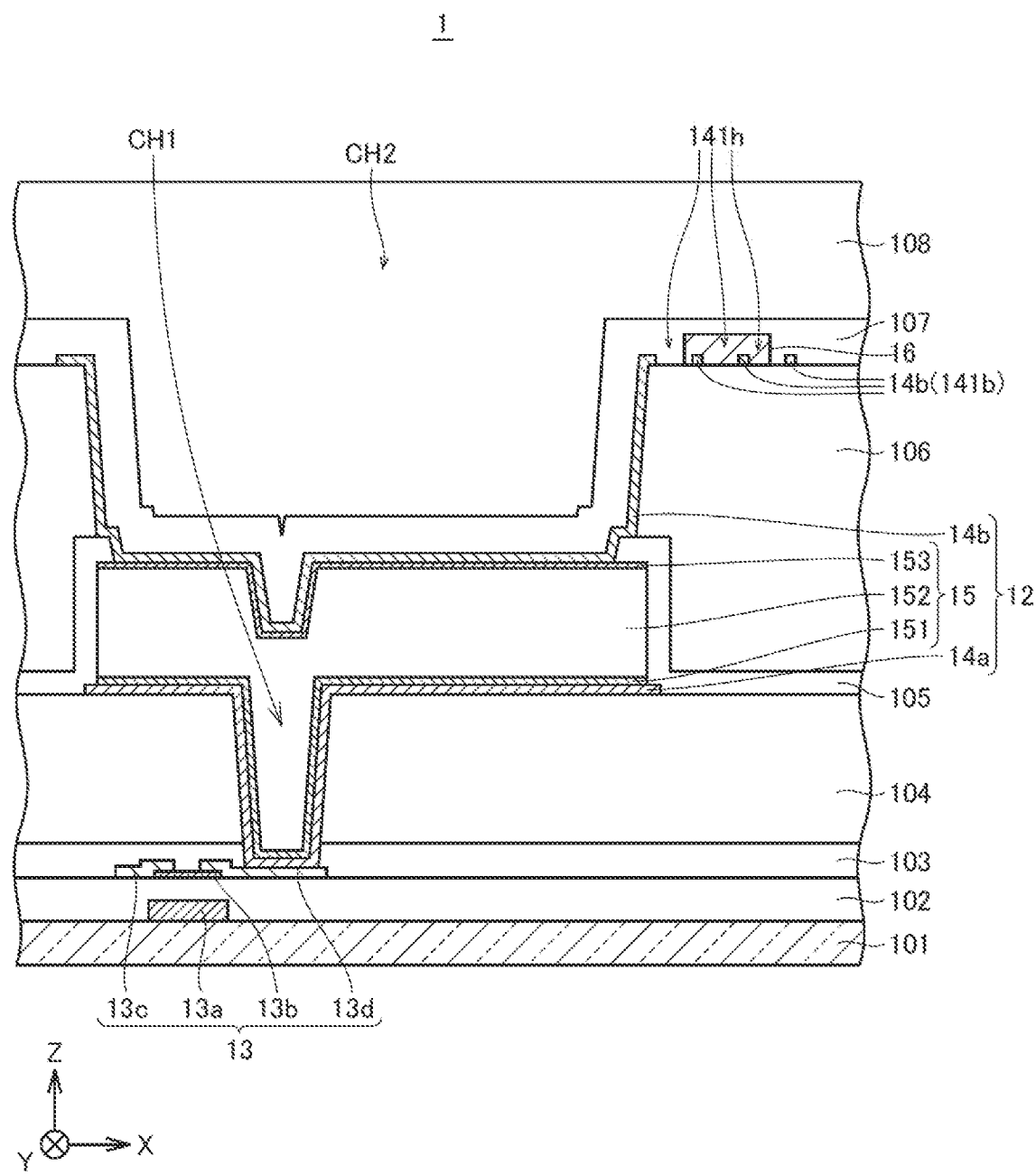
FIG. 6R is a cross-sectional view showing a step of forming the sixth insulating film shown in FIG. 4.

Subsequently, the fifth insulating film 107 made of silicon nitride (SiN) is formed by using, for example, plasma CVD, so as to cover the upper electrode 14b and the bias line 16 (see FIG. 6Q).

Thereafter, the sixth insulating film 108 made of acrylic resin or siloxane-based resin is formed on the fifth insulating film 107 by using, for example, slit-coating, (see FIG. 6R).

The method described above is the method for producing the active matrix substrate 1 in the present embodiment. As described above, in the present embodiment, at least one electrode opening 141h is formed in the electrode portion on one-side end of the upper electrode 14b, which is in contact with the bias line 16. The bias line 16 is therefore in contact with not only the upper electrode 14b but also the fourth insulating film 106 in the electrode opening 141h. In a case where the upper electrode 14b is formed with a transparent conductive film and the bias line 16 is formed with a metal film, therefore, the adhesiveness of the bias line 16 is improved, as compared with a case where the bias line 16 is in contact with only the upper electrode 14b. As a result, X-ray detection defects due to peeling-off of the bias line 16 can be decreased.

Besides, in the present embodiment, when resist used for forming the upper electrode 14b is removed after the upper electrode 14b is formed, an oxygen plasma ashing treatment is carried out. Through these steps, recesses are formed in the fourth insulating film 106, under partial electrodes 141b adjacent to the electrode openings 141h of the upper electrode 14b. The area where the bias line 16 and the fourth insulating film 106 are in contact with each other, and the area where the upper electrode 14b (the partial electrode 141b) and the bias line 16 are in contact with each other therefore increase, as compared with a case where no recess is formed in the fourth insulating film 106 under the partial electrodes 141b. As a result, the adhesiveness of the bias line 16 can be further improved.

(Operation of X-Ray Imaging Device 100)

Here, operations of the X-ray imaging device 100 illustrated in FIG. 1 are described. First, X-rays are emitted from the X-ray source 3. Here, the control unit 2 applies a predetermined voltage (bias voltage) to the bias line 16 (see FIG. 3 and the like). X-rays emitted from the X-ray source 3 are transmitted through an object S, and are incident on the scintillator 4. The X-rays incident on the scintillator 4 are converted into fluorescence (scintillation light), and the scintillation light is incident on the active matrix substrate 1. When the scintillation light is incident on the photodiode 12 provided in each pixel in the active matrix substrate 1, the scintillation light is changed to charges by the photodiode 12 in accordance with the amount of the scintillation light. A signal according to the charges obtained by conversion by the photodiode 12 is read out through the source line 10 to the signal reading unit 2B (see FIG. 2 and the like) when the TFT 13 (see FIG. 3 and the like) is in the ON state according to a gate voltage (positive voltage) that is output from the gate control unit 2A through the gate line 11. Then, an X-ray image in accordance with the signal thus read out is generated in the control unit 2.

Embodiment 2

The present embodiment is described with reference to a structure in which the adhesiveness between the bias line 16 and the upper electrode 14b is further improved as compared with Embodiment 1 described above.

Figure 7:
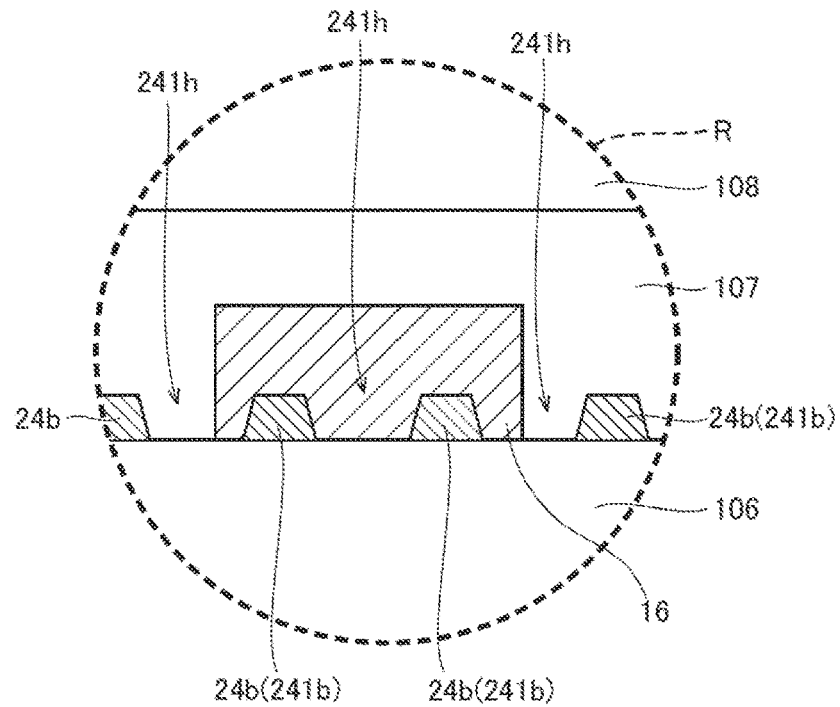
FIG. 7 is an enlarged cross-sectional view showing a part where a bias line and an upper electrode are connected in an active matrix substrate in Embodiment 2.

FIG. 7 is an enlarged view illustrating a part of an active matrix substrate in the present embodiment, that is, the part corresponding to the broken-line frame R illustrated in FIG. 4.

An upper electrode 24b in the present embodiment has a plurality of electrode openings 241h. The electrode opening 241h has such a trapezoidal cross-sectional shape that the side thereof on the fourth insulating film 106 side is shorter than the side thereof on the bias line 16 side. A partial electrode 241b of the upper electrode 24b in contact with the bias line 16 has such a trapezoidal cross-sectional shape that the upper side (on the bias line 16 side) thereof is shorter than the lower side thereof (on the fourth insulating film 106 side). In other words, in this example, the partial electrode 241b is normally tapered.

Incidentally, in this case, in the etching of the transparent conductive film 160 in the above-described step shown in FIG. 6N, the transparent conductive film 160 may be subjected to deep etching in a liquid medicament tank by using, for example, oxalic acid, and further, to shower etching. By carrying out shower etching, the treatment efficiency of the etching can be improved.

As shown in FIG. 5 referred to above, in Embodiment 1, the cross section of the partial electrode 141b of the upper electrode 14b in contact with the bias line 16 is in an approximately rectangular shape, and the partial electrode 141b has an approximately uniform thickness. In a case where the partial electrode 241b in contact with the bias line 16 is normally tapered as is the case with the present embodiment, the contact area where the partial electrode 141b and the bias line 16 are in contact with each other is greater as compared with Embodiment 1, which results in that the adhesiveness of the bias line 16 can be further improved.

Incidentally, in FIG. 7, the fourth insulating film 106 under the partial electrode 241b is flat, but the fourth insulating film 106 under the partial electrode 241b may have a smaller thickness by carrying out an oxygen plasma ashing treatment when the upper electrode 24b is formed, as is the case with Embodiment 1 (see the broken-line frame Rs in FIG. 5). With this configuration, recesses are formed in the fourth insulating film 106 under the partial electrode 241b, whereby the contact area where the bias line 16 and the fourth insulating film 106 as well as the partial electrode 241b are in contact with each other increases. As a result, the adhesiveness of the bias line 16 can be further increased.

Embodiment 3

Figure 8:
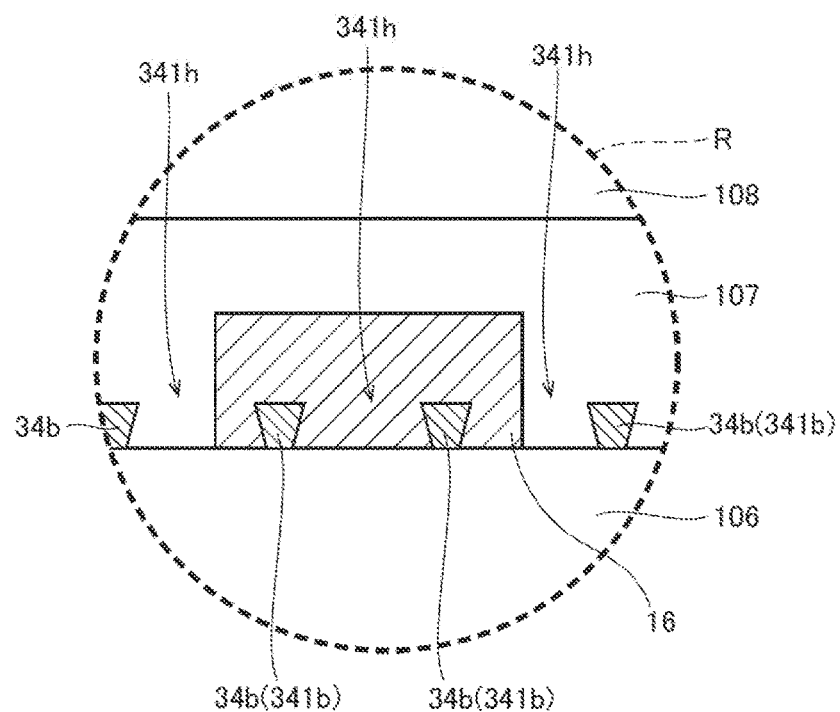
FIG. 8 is an enlarged cross-sectional view showing a part where a bias line and an upper electrode are connected in an active matrix substrate in Embodiment 3.

The present embodiment is described with reference to a structure of the upper electrode different from that of Embodiment 2. FIG. 8 is an enlarged view illustrating a part of an active matrix substrate in the present embodiment, that is, the part corresponding to the broken-line frame R illustrated in FIG. 4.

An upper electrode 34b in the present embodiment has a plurality of electrode openings 341h. The electrode opening 341h has such a trapezoidal cross-sectional shape that the side thereof on the fourth insulating film 106 side is longer than the side thereof on the bias line 16 side. A partial electrode 341b of the upper electrode 34b in contact with the bias line 16 has such a trapezoidal cross-sectional shape that the upper side (on the bias line 16 side) is longer than the lower side thereof (on the fourth insulating film 106 side). In other words, in this example, the partial electrode 341b is inversely tapered. Incidentally, in this case, the forming of the transparent conductive film 160 in the step shown in FIG. 6M referred to above is carried out in two steps. More specifically, first, the transparent conductive film 160 is formed at normal temperature, and thereafter, the transparent conductive film 160 heated at about 110° C. is formed thereon. In the case where the film is formed in a heated state, the rate of the etching in the step shown in FIG. 6N decreases in the transparent conductive film 160 part thus heated. In other words, the etching rate with respect to the transparent conductive film as the upper layer is lower than the etching rate with respect to the transparent conductive film as the lower layer, whereby the transparent conductive film (the partial electrode 141b) is in an inversely tapered shape.

In this way, the partial electrode 341b in contact with the bias line 16 is inversely tapered, whereby the contact area where the partial electrode 341b and the bias line 16 are in contact with each other increases, resulting in that the adhesiveness of the bias line 16 can be further improved, as compared with Embodiment 1.

In FIG. 8, the fourth insulating film 106 under the partial electrode 341b is flat, but as is the case with Embodiment 1, the fourth insulating film 106 under the partial electrode 341b may be formed thinner by carrying out an oxygen plasma ashing treatment when the upper electrode 34b is formed. With this configuration, recesses are formed in the fourth insulating film 106 under the partial electrode 341b, whereby the contact area where the bias line 16 and the fourth insulating film 106 as well as the partial electrode 341b are in contact with each other increases, resulting in that the adhesiveness of the bias line 16 can be further improved.

Embodiment 4

In Embodiment 1 described above, when the upper electrode 14b is formed, an oxygen plasma ashing treatment is carried out, but the oxygen plasma ashing treatment does not have to be carried out.

Figure 9:
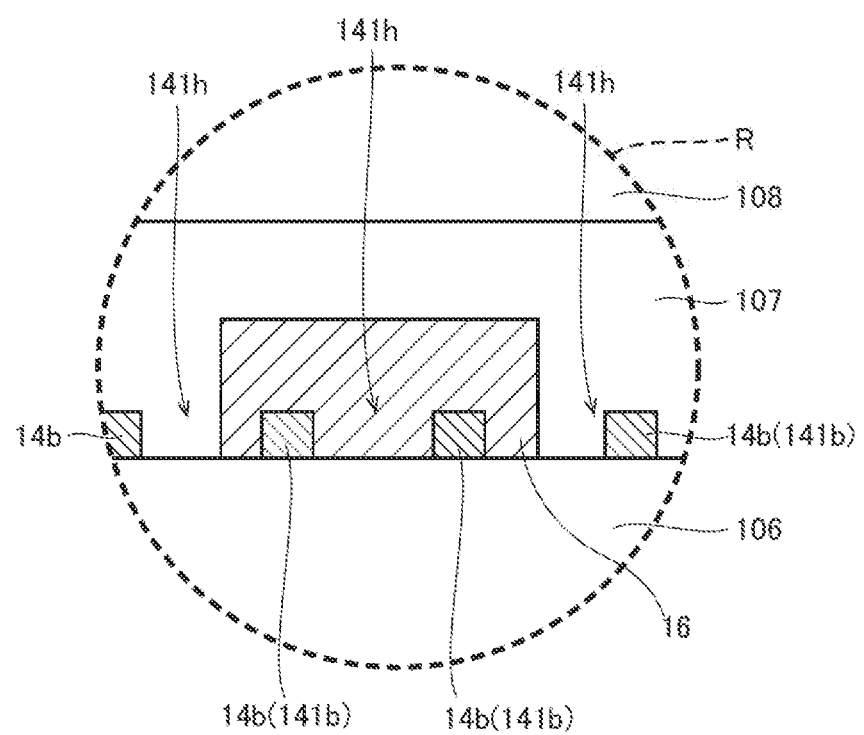
FIG. 9 is an enlarged cross-sectional view showing a part where a bias line and an upper electrode are connected in an active matrix substrate in Embodiment 4.

In the case where the oxygen plasma ashing treatment is not carried out, the fourth insulating film 106 under the partial electrode 141b of the upper electrode 14b remains flat, as shown in FIG. 9. With this configuration, the area where the contact bias line 16 is in contact with the fourth insulating film 106 and the partial electrodes 141b in the electrode openings 141h is smaller than that in Embodiment 1. The adhesiveness of the bias line 16, however, can be improved, as compared with a case where the bias line 16 is in contact with only the upper electrode 14b.

Embodiment 5

Embodiment 1 is described above with reference to an exemplary case where the partial electrode 141b of the upper electrode 14b is provided on the fourth insulating film 106, but the following description describes a structure in which the partial electrode 141b is provided on the third insulating film 105.

Figure 10:
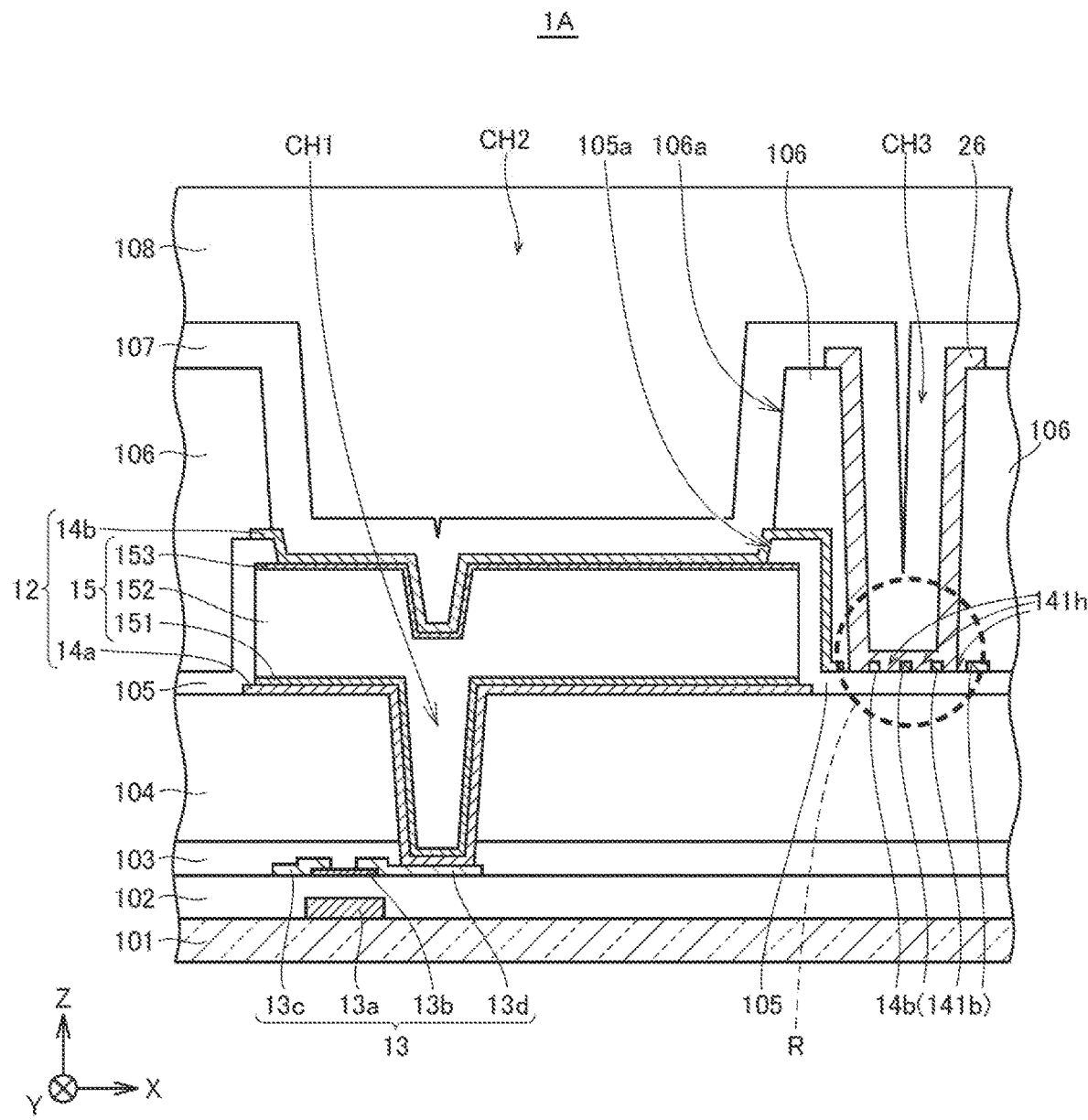
FIG. 10 is a schematic cross-sectional view showing a pixel of an active matrix substrate in (1) of Embodiment 5.

(1) FIG. 10 is a cross-sectional view of a pixel portion of an active matrix substrate 1A in the present embodiment. In FIG. 10, the same constituent members as those in Embodiment 1 are denoted by the same reference symbols as those in Embodiment 1. The following description principally describes structures different from those in Embodiment 1.

In the active matrix substrate 1A, as illustrated in a broken-line frame R in FIG. 10, the partial electrodes 141b of the upper electrode 14b are provided on the third insulating film 105 on an outer side with respect to the photoelectric conversion layer 15. In a layer upper with respect to the upper electrode 14b covering the side surfaces of the photoelectric conversion layer 15, and the partial electrodes 141b, the fourth insulating film 106 is provided. In a part of the fourth insulating film 106 that overlaps with the partial electrodes 141b when viewed in a plan view, a contact hole CH3 is formed. A bias line 26 is provided on the fourth insulating film 106 and the third insulating film 105 so as to be in contact with partial electrodes 141b in the contact hole CH3.

In this way, the bias line 26 is in contact with the third insulating film 105 in the electrode openings 141h, and is in contact with the partial electrodes 141b. The adhesiveness of the bias line 26 can be therefore improved, as compared with a case where the electrode openings 141h are not formed in the upper electrode 14b. Besides, since the third insulating film 105 as an inorganic insulating film has higher adhesiveness with the bias line 26, as compared with the fourth insulating film 106 as an organic insulating film, it is less likely that the bias line 26 would peel off.

Figure 11:
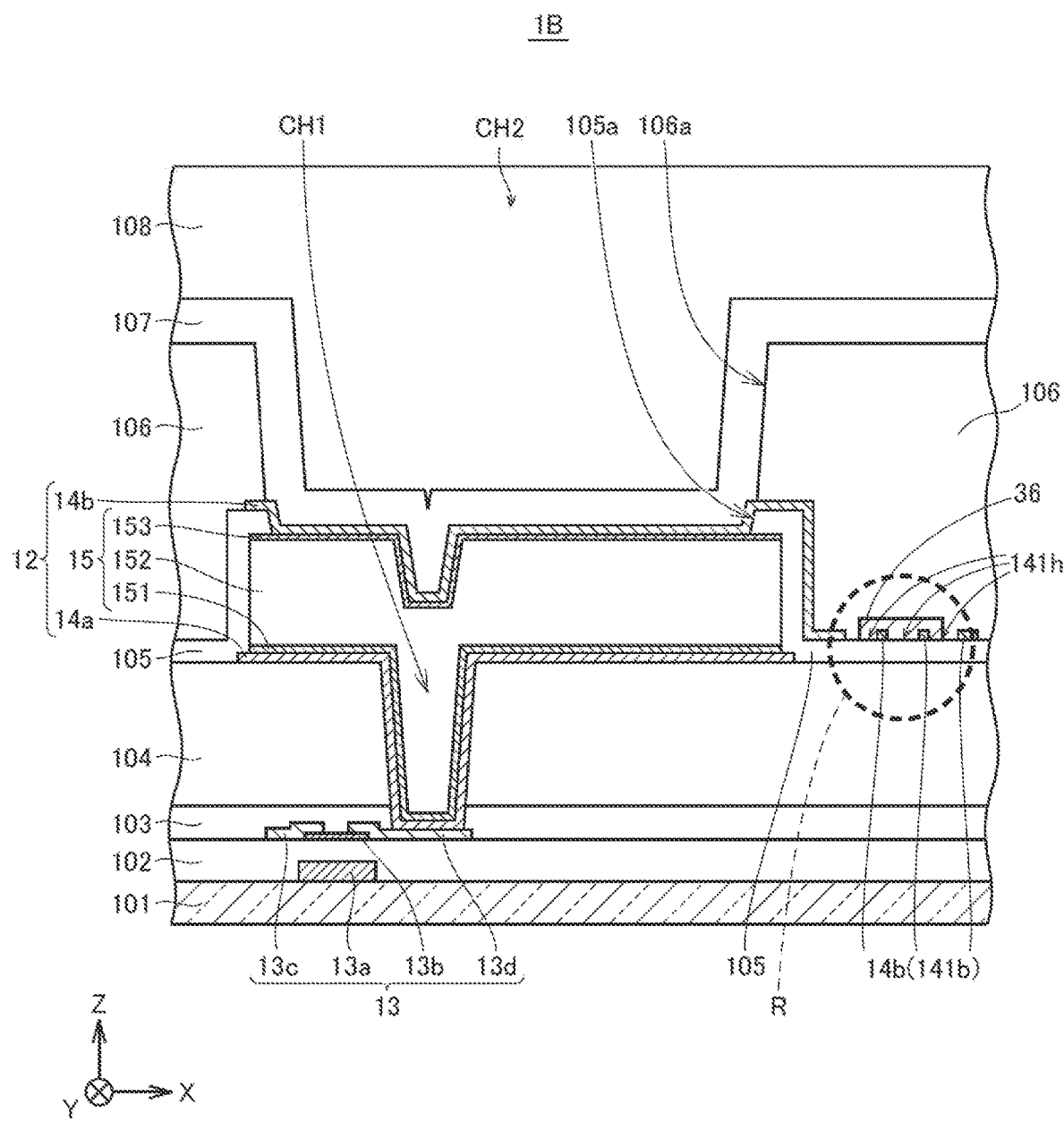
FIG. 11 is a schematic cross-sectional view showing a pixel of an active matrix substrate in (2) of Embodiment 5.

(2) FIG. 11 is a cross-sectional view illustrating an exemplary structure of an active matrix substrate different from that in FIG. 10 referred to above regarding the arrangement of the bias line. Incidentally, in FIG. 11, the same constituent members as those in (1) described above are denoted by the same reference symbols as those in (1) described above. The following description principally describes structures different from those in FIG. 10.

In an active matrix substrate 1B, as illustrated in a broken-line frame R in FIG. 11, the partial electrodes 141b are provided on the third insulating film 105, and the bias line 36 is provided on the third insulating film 105 so as to cover the partial electrodes 141b. The fourth insulating film 106 is provided on the upper electrode 14b covering the side surfaces of the photoelectric conversion layer 15, the partial electrodes 141b, and the bias line 36.

In this case as well, the bias line 36 is in contact with the third insulating film 105 in the electrode openings 141h, and is in contact with the partial electrodes 141b. The adhesiveness of the bias line 26 can be therefore improved, as compared with a case where the electrode openings 141h are not formed in the upper electrode 14b.

Figure 12:
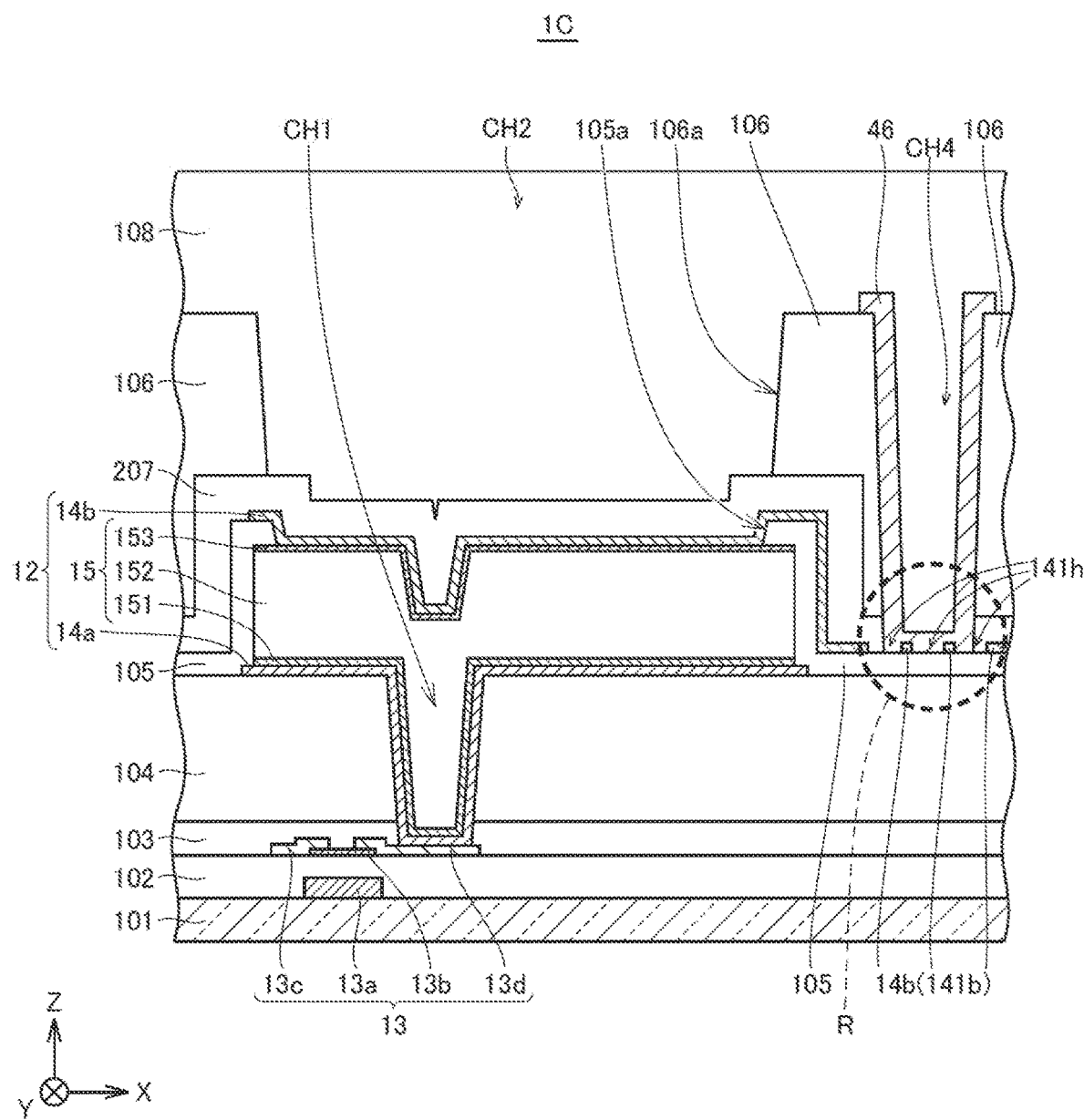
FIG. 12 is a schematic cross-sectional view showing a pixel of an active matrix substrate in (3) of Embodiment 5.

(3) In the exemplary case shown in FIG. 10, the fifth insulating film 107 covers the fourth insulating film 106, but the fourth insulating film 106 may be provided so as to cover the fifth insulating film 107. FIG. 12 is a cross-sectional view showing a structure of an active matrix substrate in this case. The following description describes structures different from those in FIG. 10 referred to above.

As shown in FIG. 12, in an active matrix substrate 1C, a fifth insulating film 207 as an inorganic insulating film is provided on the upper electrode 14b, as well as the partial electrodes 141b and the third insulating film 105, on an outer side with respect to the photoelectric conversion layer 15. Further, the fourth insulating film 106 is provided on the fifth insulating film 207, on an outer side with respect to the photoelectric conversion layer 15, and a contact hole CH4 that passes through the fourth insulating film 106 and the fifth insulating film 207 is formed at a position that overlaps with the partial electrodes 141b when viewed in a plan view. In the contact hole CH4, the bias line 46 is in contact with the third insulating film 105 in the electrode openings 141h, and is in contact with the partial electrodes 141b.

In this way, in the electrode openings 141h, the bias line 46 is in contact with the third insulating film 105, and at the same time, is in contact with the partial electrodes 141b. The adhesiveness of the bias line 46 can be therefore improved, as compared with a case where the electrode openings 141h are not formed in the upper electrode 14b.

Figure 13:
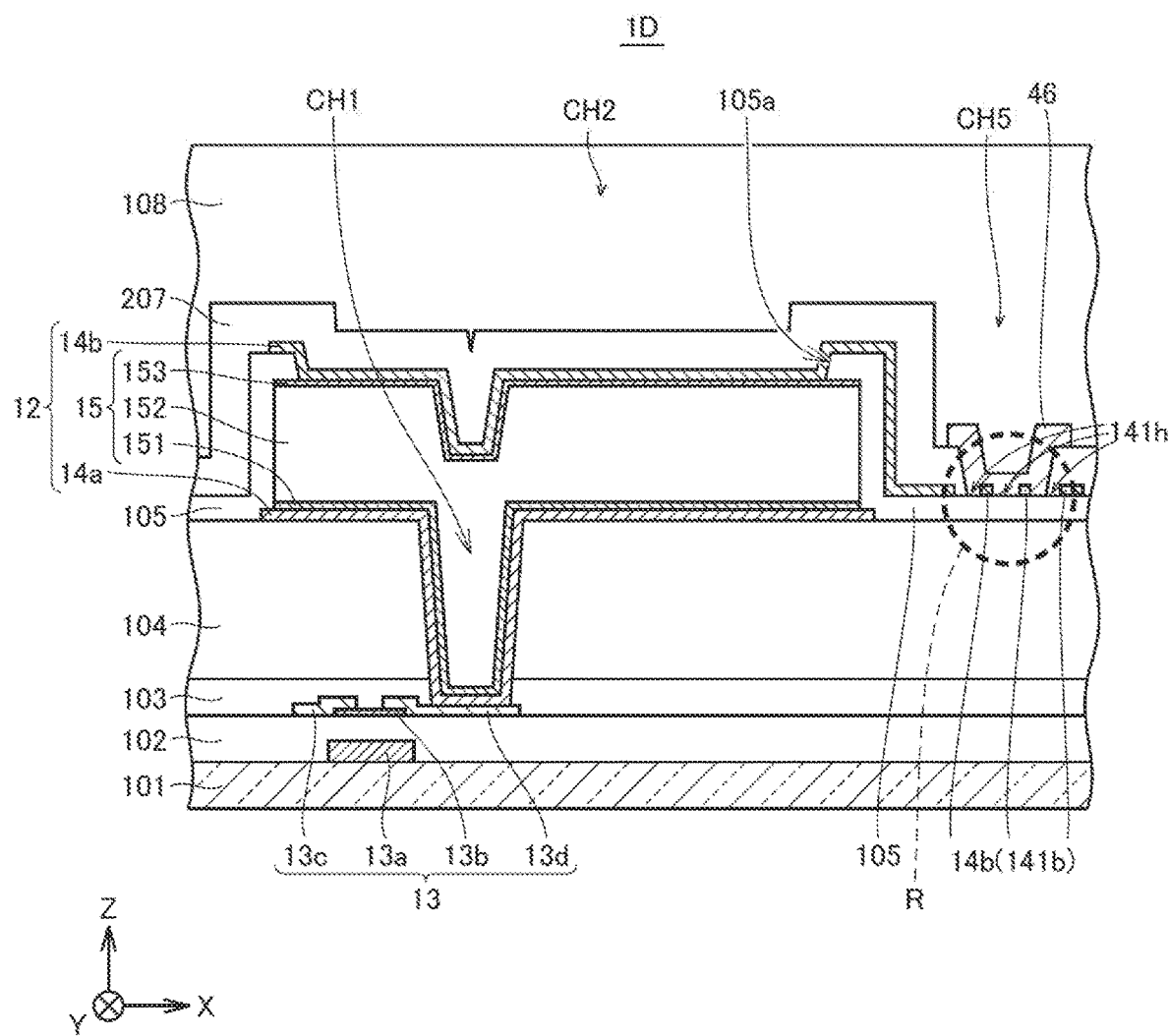
FIG. 13 is a schematic cross-sectional view showing a pixel of an active matrix substrate in (4) of Embodiment 5.

(4) In the exemplary case shown in FIG. 12, the fourth insulating film 106 is provided, but the fourth insulating film 106 does not have to be provided. FIG. 13 is a cross-sectional view illustrating a structure of an active matrix substrate in a case where the fourth insulating film 106 is not provided. The following description describes structures different from those in FIG. 12.

As shown in FIG. 13, in the active matrix substrate 1C, no fourth insulating film 106 is provided on the fifth insulating film 207. The fifth insulating film 207 has a contact hole CH5 on an outer side with respect to the photoelectric conversion layer 15, at a position that overlaps with the partial electrodes 141b when viewed in a plan view. The bias line 56 is provided on the fifth insulating film 207 and the third insulating film 105 so as to overlap the partial electrodes 141b in the contact hole CH5. The sixth insulating film 108 covers the fifth insulating film 207 and the bias line 56.

In this way, the bias line 56 is in contact with the third insulating film 105, and at the same time, is in contact with the partial electrodes 141b, in the electrode openings 141h. The adhesiveness of the bias line 56 can be therefore improved, as compared with a case where the electrode openings 141h are not formed in the upper electrode 14b. Besides, as the fourth insulating film 106 is not provided, the step of forming the fourth insulating film 106 can be omitted, as compared with the configuration in which the fourth insulating film 106 is provided.

In (1) to (4) described above, an exemplary case where the partial electrode 141b has an approximately rectangular cross-sectional shape is described, but the cross-sectional shape of the partial electrode 141b may be a trapezoidal shape, as is the case with Embodiment 2 or Embodiment 3 described above. In other words, each partial electrode 141b may be in a normally tapered shape or in an inversely tapered shape. With such a configuration, the contact area where the bias line and the partial electrodes 141b are in contact with each other increases, the adhesiveness of the bias line can be further improved.

The above-described embodiment is merely an example for implementing the present invention. The present invention, therefore, is not limited to the above-described embodiment, and the above-described embodiment can be appropriately varied and implemented without departing from the spirit and scope of the invention. The following description describes modification examples.

(1) Embodiments 1 to 5 are described above with reference to an exemplary case where a plurality of electrode openings 141h are formed on an outer side with respect to the photoelectric conversion layer 15, at a one-side end of the upper electrode 14b; at least one electrode opening 141h may be formed, however.

As the number of the electrode openings 141h increases, the contact area where the bias line and the fourth insulating film 106 or the third insulating film 105 are in contact with each other increases, whereby the adhesiveness of the bias line is improved. By providing at least one electrode opening 141h at a one-side end of the upper electrode 14b, however, the bias line is in contact with the fourth insulating film 106 or the third insulating film 105 in the electrode opening 141h. This therefore makes it possible to improve the adhesiveness of the bias line, as compared with a case where the electrode opening 141h is not provided.

CROSS REFERENCE TO RELATED APPLICATION

The present application claims priority under 35 U.S.C. § 119 to Japanese Patent Application No. 2018-026464, filed Feb. 16, 2018. The contents of this application are incorporated herein by reference in their entirety.

The invention claimed is:

1. An active matrix substrate having a plurality of detection circuitry arranged in matrix,
each of the detection circuitry comprising:
a photoelectric conversion layer;
a pair of a first electrode and a second electrode between which the photoelectric conversion layer is interposed;
a protection film that overlaps with a side end part of the photoelectric conversion layer in a plan view; and
a bias line that is applies a bias voltage to the second electrode,
wherein the bias line is provided on a surface of the protection film and outside of the photoelectric conversion layer in a plan view,
a one-side end of the second electrode is provided with a connection portion that is connected to the bias line on the surface of the protection film and outside of the photoelectric conversion layer in a plan view, the connection portion including at least one electrode opening to expose the surface of the protection film, and
the bias line overlaps with the connection portion of the second electrode, and is in contact with the surface of the protection film in the electrode opening.

2. The active matrix substrate according to claim 1,
wherein the protection film is an inorganic insulating film, has an opening at a position overlapping the photoelectric conversion layer in a planar view, and is provided so as to cover a side surface of the photoelectric conversion layer, and
the second electrode is in contact with the photoelectric conversion layer in the opening.

3. The active matrix substrate according to claim 1, further comprising an inorganic insulating film that has an opening at a position overlapping the photoelectric conversion layer in a planar view, and is in contact with a side surface of the photoelectric conversion layer,
wherein the protection film is an organic insulating film, and overlaps with the side surface of the photoelectric conversion layer with the inorganic insulating film being interposed therebetween, and
the second electrode is in contact with the photoelectric conversion layer in the opening.

4. The active matrix substrate according to claim 1,
wherein the bias line extends between the protection film and a surface of the second electrode opposing the protection film at the connection portion of the second electrode.

5. The active matrix substrate according to claim 1,
wherein the electrode portion of the second electrode adjacent to the electrode opening is tapered.

6. An X-ray imaging panel comprising:
the active matrix substrate according to claim 1; and
a scintillator that convers irradiated X-rays into scintillation light.

7. A method for producing an active matrix substrate that includes a plurality of detection circuitry arranged in matrix, the producing method comprising the steps of, in each of areas where the detection circuitry on the substrate are provided, respectively:
forming a first electrode;
forming a photoelectric conversion layer on the first electrode;
forming a protection film that has an opening on the photoelectric conversion layer and overlaps with a side end part of the photoelectric conversion layer in a plan view;
forming a second electrode that is in contact with the photoelectric conversion layer in the opening, and overlaps with the protection film outside of the photoelectric conversion layer; and
forming a bias line that overlaps with the second electrode in a plan view outside of the ends of the photoelectric conversion layer,
wherein, when forming the second electrode, forming, at an end of the second electrode, a connection portion that is connected to the bias line on a surface of the protection film and outside of the photoelectric conversion layer in a plan view, the connection portion including at least one electrode opening to expose the surface of the protection film, and
when forming the bias line, the bias line is formed to cover the connection portion of the second electrode and to be in contact with the surface of the protection film in the electrode opening.

8. The producing method according to claim 7,
wherein, when forming the second electrode, a transparent conductive film as the second electrode is formed on the photoelectric conversion layer, resist is applied over the transparent conductive film and patterning is carried out, and thereafter, an ashing treatment is carried out so as to remove the resist to form a recessed portion in which the bias line extends between the protection film and a surface of the second electrode opposing the protection film at the connection portion of the second electrode.

* * * * *